(12) United States Patent
Fujii et al.

(10) Patent No.: US 11,002,808 B2
(45) Date of Patent: May 11, 2021

(54) GAS CELL, MAGNETOMETRIC DEVICE, METHOD OF MANUFACTURING GAS CELL, AND METHOD OF MANUFACTURING MAGNETOMETRIC DEVICE

(71) Applicant: SEIKO EPSON CORPORATION, Tokyo (JP)

(72) Inventors: Eiichi Fujii, Shiojiri (JP); Kimio Nagasaka, Hokuto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 930 days.

(21) Appl. No.: 15/686,461

(22) Filed: Aug. 25, 2017

(65) Prior Publication Data

US 2018/0059194 A1 Mar. 1, 2018

(30) Foreign Application Priority Data

Aug. 31, 2016 (JP) .............................. JP2016-168975

(51) Int. Cl.
*G01R 33/26* (2006.01)
*G01R 33/00* (2006.01)
*H03L 7/26* (2006.01)

(52) U.S. Cl.
CPC ......... *G01R 33/26* (2013.01); *G01R 33/0052* (2013.01); *H03L 7/26* (2013.01)

(58) Field of Classification Search
CPC ........ G01R 33/26; G01R 33/0052; H03L 7/26
USPC .................... 331/3, 94.1; 324/305
See application file for complete search history.

(56) References Cited

U.S. PATENT DOCUMENTS

| 9,151,808 B2 * | 10/2015 | Nagaska ............ G01R 33/032 |
| 10,393,625 B2 * | 8/2019 | Nguyen-Tuong ...... G01D 3/028 |
| 2012/0206135 A1 | 8/2012 | Nagasaka et al. |
| 2015/0377984 A1 | 12/2015 | Nagasaka et al. |
| 2016/0139215 A1 | 5/2016 | Fujii |

FOREIGN PATENT DOCUMENTS

| JP | 2012-183290 A | 9/2012 |
| JP | 2013-172811 A | 9/2013 |
| JP | 2016-095262 A | 5/2016 |

* cited by examiner

*Primary Examiner* — Arnold M Kinkead
(74) *Attorney, Agent, or Firm* — Oliff PLC

(57) ABSTRACT

A gas cell includes a cell having a principal chamber having a coating material film formed on an inside wall, a reservoir arranged with the principal chamber along the longitudinal direction and communicating with to the principal chamber, a reinforcement section extending from the reservoir side of the principal chamber in an X-axis direction along the reservoir, an opening section disposed on an opposite side of the reservoir to the principal chamber, and a sealing section adapted to block the opening section, and an alkali metal gas encapsulated in the principal chamber, and the reinforcement section is provided with one of at least one hole and at least one groove.

11 Claims, 12 Drawing Sheets

GAS CELL, MAGNETOMETRIC DEVICE, METHOD OF MANUFACTURING GAS CELL, AND METHOD OF MANUFACTURING MAGNETOMETRIC DEVICE

BACKGROUND

1. Technical Field

The present invention relates to a gas cell, a magnetometric device, a method of manufacturing the gas cell, and method of manufacturing the magnetometric device.

2. Related Art

There has been known an optical pumping type magnetometric device for irradiating a gas cell with linearly polarized light, and measuring a magnetic field in accordance with a rotational angle of a polarization plane. The magnetometric device described in JP-A-2016-095262 (Document 1) is provided with a gas cell with an alkali metal gas encapsulated in a cell having a principal chamber and a reservoir. In a planar view of the cell shown in FIG. 2(a) of Document 1, the reservoir is disposed on one of the four sidewalls of the principal chamber.

In such a gas cell, it is preferable to form a film with a coating material made of paraffin or the like in order to improve the non-relaxation characteristic of the inside wall of the principal chamber. In the case of forming the coating material film, it is sufficient to, for example, introduce a coating material in the cell, then heat and then cool the whole of the cell. By heating the whole of the cell, the coating material evaporates in the cell, and by subsequently cool the whole of the cell, the coating material film is formed so as to cover the inside wall of the principal chamber.

Incidentally, in the gas cell described in Document 1, among the walls surrounding the principal chamber, the thickness of the wall on the side, on which the reservoir is disposed, is larger than the thickness of other walls as much as the existence of the reservoir. In other words, among the walls surrounding the principal chamber, the volume of the wall on the side, on which the reservoir is disposed, is greater than the volume of the any one of other walls. Therefore, in the case of heating the whole of the cell to evaporate the coating material and then cooling the whole of the cell to form the coating material film on the inside wall of the principal chamber, a temperature difference is apt to occur between the wall on the side, on which the reservoir is disposed, and other walls due to the difference in heat capacity. As a result, there is a possibility that a variation in film thickness or lumps of coating material are caused in the coating material film formed on the inside wall of the principal chamber. If the variation in film thickness or the lumps of the coating material are caused in the coating material film, there arises a problem that there is incurred degradation in quality (e.g., sensitivity and measurement accuracy) of the gas cell and the magnetometric device.

SUMMARY

An advantage of some aspects of the invention is to solve at least a part of the problems described above, and the invention can be implemented as the following forms or application examples.

Application Example 1

A gas cell according to this application example includes a cell including a first chamber having a coating material formed on an inside wall, a second chamber arranged with the first chamber along a first direction and communicating with the first chamber, a reinforcement section extending from the second chamber side of the first chamber in the first direction along the second chamber, and an opening section disposed on an opposite side of the second chamber to the first chamber, a sealing section adapted to block the opening section, and an alkali metal gas encapsulated in the first chamber, and the reinforcement section is provided with one of at least one hole and at least one groove.

According to the configuration of this application example, there is disposed the reinforcement section extending from the second chamber side of the first chamber, which has the coating material formed on the inside wall and encapsulates the alkali metal gas, along the second chamber in the first direction. Therefore, since the wall of the first chamber located on the second chamber side is thicker than other walls of the first chamber as much as the existence of the second chamber and the reinforcement section, the volume of the wall on the second chamber side is larger than the volume of other walls. Here, since the reinforcement section is provided with the hole or the groove, the substantive volume of the wall of the first chamber located on the second chamber side can be reduced compared to the case in which the hole or the groove is not formed. Therefore, when heating the whole of the cell to evaporate the coating material and then cooling the whole of the cell in order to form the coating material on the inside wall of the first chamber, it is possible to reduce the temperature difference caused by the difference in heat capacity between the wall of the first chamber on the second chamber side and other walls of the first chamber. Thus, it is possible to prevent the variation in film thickness of the coating material film formed on the inside walls of the first chamber and the lumps of the coating material from occurring. Thus, it is possible to provide the gas cell high in quality (e.g., sensitivity and measurement accuracy).

Application Example 2

In the gas cell according to the application example described above, it is preferable that one of the at least one hole and the at least one groove extends along the first direction.

If the reinforcement section is not provided to the gas cell, when force is applied from the first chamber side of the gas cell along the first direction in which the first chamber and the second chamber are arranged, there is a possibility that the force is concentrated on the part where the second chamber of the gas cell is located to damage the part. According to the configuration of this application example, since the reinforcement section is disposed on the side of the second chamber crossing the first direction, the force applied from the first chamber side of the gas cell along the first direction is dispersed by the reinforcement section, and therefore, damage of the gas cell can be prevented. Further, the hole or the groove provided to the reinforcement section extends along the first direction in which the first chamber and the second chamber are arranged. In other words, the part in the periphery of the hole or the groove in the reinforcement section extends along the first direction. Therefore, compared to the case in which the hole or the groove extend along the direction crossing the first direction, the strength of the reinforcement section against the force applied from the first direction can be improved.

Application Example 3

In the gas cell according to the application example described above, it is preferable that the second chamber has a longitudinal direction, and the longitudinal direction is the first direction.

According to the configuration of this application example, the second chamber has the longitudinal direction along the first direction in which the first chamber and the second chamber are arranged. If the force is applied from the direction crossing the longitudinal direction to the part where the second chamber of the gas cell is located, damage is easily caused. However, since the reinforcement section is disposed on the side crossing the longitudinal direction (the first direction) of the second chamber, the damage of the gas cell due to the force applied from the direction crossing the longitudinal direction can be prevented.

Application Example 4

In the gas cell according to the application example described above, it is preferable that the number of one of the at least one hole and the at least one groove is larger than one, and one of the plurality of holes and the plurality of grooves is connected to each other.

According to the configuration of this application example, since the reinforcement section is provided with a plurality of holes or a plurality of grooves, and those are connected to each other, it is possible to further reduce the substantive volume of the wall of the first chamber located on the second chamber side. Therefore, when heating the whole of the cell to evaporate the coating material and then cooling the whole of the cell in order to form the coating material on the inside wall of the first chamber, it is possible to further reduce the temperature difference caused by the difference in heat capacity between the wall of the first chamber on the second chamber side and other walls of the first chamber.

Application Example 5

A magnetometric device according to this application example includes the gas cell described above.

According to the configuration of this application example, since there is included the gas cell in which the variation in film thickness of the film of the coating material formed on the inside wall of the first chamber and the lumps of the coating material are prevented from occurring, it is possible to provide the magnetometric device high in quality (e.g., sensitivity and measurement accuracy).

Application Example 6

A method of manufacturing a gas cell according to this application example includes the steps of preparing a cell having a first chamber, a second chamber arranged with the first chamber along a first direction and communicating with the first chamber, a reinforcement section disposed on the second chamber side of the first chamber and on a side of the second chamber crossing the first direction, and provided with one of at least one hole and at least one groove, and an opening section disposed on an opposite side of the second chamber to the first chamber, introducing a coating material into the first chamber through the opening section, sealing the opening section with a sealing section, and forming the coating material on an inside wall of the first chamber by heating and then cooling the cell.

According to the manufacturing method of this application example, the coating material is introduced into the first chamber through the opening section of the cell, the opening section is sealed with the sealing section, and the coating material is formed on the inside wall of the first chamber by heating and then cooling the cell in the step of forming the coating material. The reinforcement section is disposed on the second chamber side of the first chamber of the cell and the side of the second chamber crossing the first direction, and the wall of the first chamber on the second chamber side is thicker than other walls of the first chamber as much as the existence of the second chamber and the reinforcement section. Therefore, the volume of the wall on the second chamber side is larger than the volume of other walls. However, since the reinforcement section is provided with the hole or the groove, the substantive volume of the wall of the first chamber located on the second chamber side can be reduced compared to the case in which the hole or the groove is not formed. Thus, it is possible to prevent the variation in film thickness of the coating material film formed on the inside walls of the first chamber in the step of forming the coating material, and the lumps of the coating material from occurring. Thus, it is possible to manufacture the gas cell high in quality (e.g., sensitivity and measurement accuracy).

Application Example 7

In the method of manufacturing the gas cell according to the application example described above, it is preferable that in the step of sealing the opening section, the cell is disposed on the sealing section so that the first direction is parallel to a vertical direction, and the opening section is located on a lower side in the vertical direction.

According to the manufacturing method related to this application example, the cell is disposed on the sealing section in the step of sealing the opening section so that the first direction in which the first chamber and the second chamber are arranged is parallel to the vertical direction, and the second chamber provided with the opening section is located on the lower side. On this occasion, since the reinforcement section is disposed on the side crossing the first direction of the second chamber, the cell can be held in the stable state, and at the same time, the force applied from the first chamber of the cell along the first direction can be dispersed to the reinforcement section. Thus, it is possible to seal the opening section while preventing the damage of the cell.

Application Example 8

In the method of manufacturing the gas cell according to the application example described above, it is preferable to further include the steps of disposing a solid substance including alkali metal inside the second chamber through the opening section before the step of sealing the opening section, and irradiating the solid substance with a laser beam after the step of forming the coating material.

According to the manufacturing method related to this application example, the solid state substance disposed inside the second chamber and including the alkali metal is irradiated with the laser beam to thereby generate the alkali metal gas inside the cell. Since the coating material is formed on the inside wall of the first chamber, it is possible to suppressor reduce the variation of the behavior of the excited alkali metal atom when directly colliding with the inside wall of the cell. Further, since the variation of the film thickness of the film of the coating material and the lumps of the coating material can be prevented from occurring in the step of forming the coating material, it is possible to manufacture the gas cell high in quality (e.g., sensitivity and measurement accuracy).

Application Example 9

A method of manufacturing a magnetometric device according to this application example includes the method of manufacturing the gas cell described above.

According to the manufacturing method related to this application example, it is possible to manufacture the magnetometric device high in quality (e.g., sensitivity and measurement accuracy).

BRIEF DESCRIPTION OF THE DRAWINGS

The invention will be described with reference to the accompanying drawings, wherein like numbers reference like elements.

DESCRIPTION OF EXEMPLARY EMBODIMENTS

Some embodiments in which the invention is implemented will hereinafter be described with reference to the accompanying drawings. The drawings used are shown with appropriate expansion, contraction, or exaggeration so that parts to be explained become in a recognizable state. Further, in some cases, those other than the constituents necessary for the explanation will be omitted from the illustration.

First Embodiment

Configuration of Magnetometric Device

Figure 1:
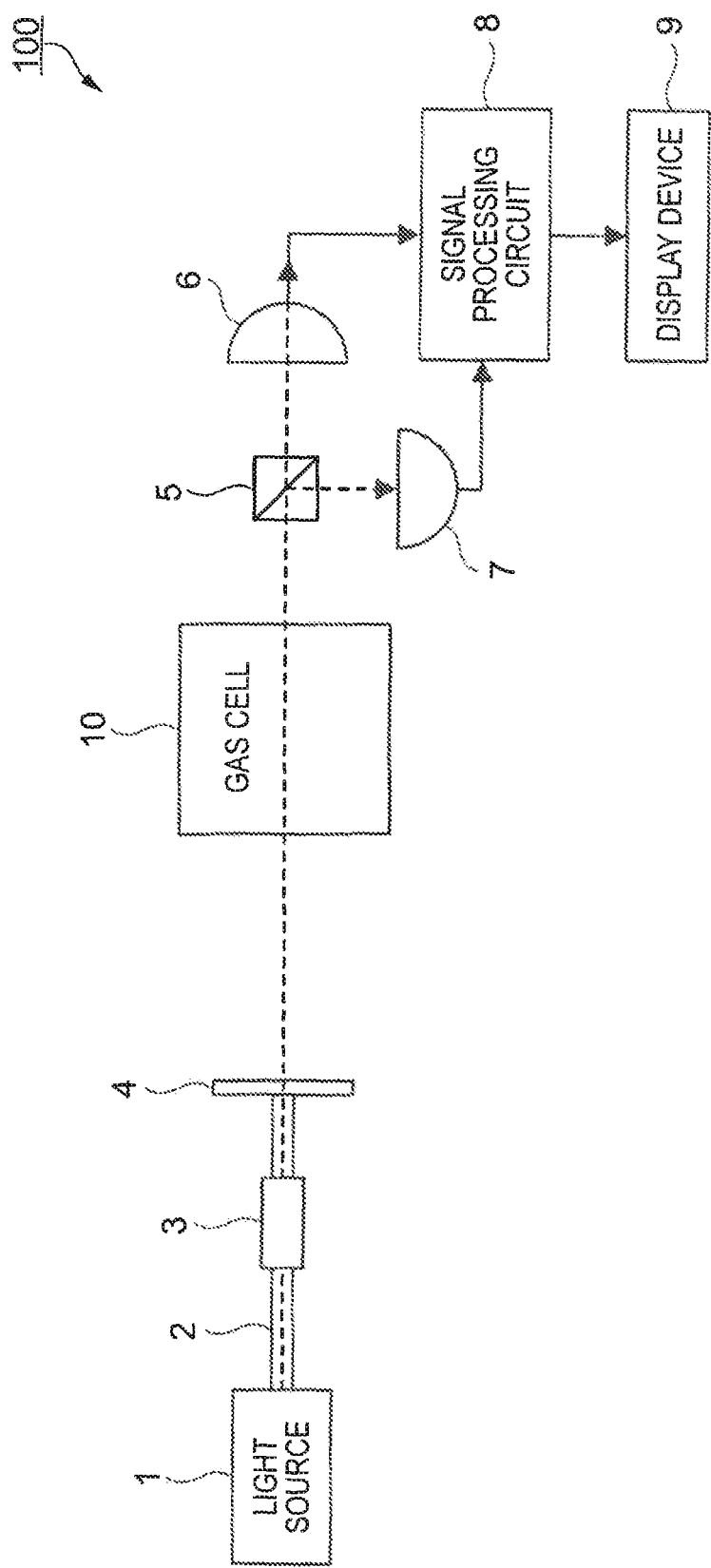
FIG. 1 is a block diagram showing a configuration of a magnetometric device according to an embodiment of the invention.

A configuration of the magnetometric device according to the first embodiment will be described with reference to FIG. 1. FIG. 1 is a block diagram showing the configuration of the magnetometric device according to the present embodiment. The magnetometric device 100 according to the present embodiment is a magnetometric device using nonlinear magneto-optical rotation (NMOR). The magnetometric device 100 is used for a biological state measurement device (e.g., a magnetocardiograph or magnetoencephalograph) for measuring a minute magnetic field generated by a living tissue such as a magnetic field (a heart's magnetic field) from a heart or a magnetic field (a brain's magnetic field). The magnetometric device 100 can also be used for a metal detector and so on.

As shown in FIG. 1, the magnetometric device 100 is provided with a light source 1, an optical fiber 2, a connector 3, a polarization plate 4, a gas cell 10, a polarization splitter 5, a photodetector (PD) 6, a photodetector 7, a signal processing circuit 8, and a display device 9. In the gas cell 10, there is encapsulated an alkali metal gas (gaseous alkali metal atoms). As the alkali metal, there can be used, for example, cesium (Cs), rubidium (Rb), potassium (K), and sodium (Na). Hereinafter, the description will be presented taking the case of using cesium as the alkali metal as an example.

The light source 1 is a device for outputting a laser beam with the wavelength (e.g., 894 nm corresponding to the Dl line) corresponding to the absorption line of cesium. The laser beam output from the light source 1 is so-called continuous wave (CW) light continuously having constant light intensity.

The polarization plate 4 is an element for polarizing the laser beam in a specific direction to convert the laser beam into linearly polarized light. The optical fiber 2 is a member for guiding the laser beam, which is output by the light source 1, toward the gas cell 10. For the optical fiber 2, there is used, for example, a single mode optical fiber for propagating only the basic mode. The connector 3 is a member for connecting the optical fiber 2 to the polarization plate 4. The connector 3 connects the optical fiber 2 to the polarization plate 4 using a threaded configuration.

The gas cell 10 is a box (cell) having voids inside, and in the void (a principal chamber 14 shown in FIG. 2), there is encapsulated vapor (an alkali metal gas 13 shown in FIG. 2) of the alkali metal. A configuration of the gas cell 10 will be described later.

The polarization splitter 5 is an element for splitting the incident laser beam into two beams of polarization components perpendicular to each other. The polarization splitter 5 is, for example, a Wollaston prism or a polarization beam splitter. The photodetector 6 and the photodetector 7 are each a detector having sensitivity to the wavelength of the laser beam, and each output a current corresponding to the light intensity of the incident light to the signal processing circuit 8. Since there is a possibility that the photodetector 6 and the photodetector 7 have an influence on the measurement if the photodetector 6 and the photodetector 7 generate a magnetic field, it is desirable for the photodetector 6 and the photodetector 7 to be formed of a nonmagnetic material. The photodetector 6 and the photodetector 7 are disposed on the same side as (on the downstream side of) the polarization splitter 5 viewed from the gas cell 10.

In the description of the arrangement of the sections in the magnetometric device 100 along the path of the laser beam, the light source 1 is located in the uppermost stream of the path of the laser beam, and the optical fiber 2, the connector 3, the polarization plate 4, the gas cell 10, the polarization splitter 5, and the photodetectors 6, 7 are subsequently disposed in this order from the upstream side.

The laser beam output from the light source 1 is guided by the optical fiber 2 to reach the polarization plate 4. The laser beam having reached the polarization plate 4 turns to linearly polarized light higher in polarization degree. The laser beam having been transmitted through the gas cell excites (optically pumps) the alkali metal atoms encapsulated in the gas cell 10. On this occasion, the polarization plane of the laser beam rotates in response to the polarization rotation action corresponding to the intensity of the magnetic field. The laser beam having been transmitted through the gas cell 10 is split by the polarization splitter 5 into two beams of the polarization components. The light intensities of the two beams of the polarization components are respectively measured (probed) by the photodetector 6 and the photodetector 7.

The signal processing circuit 8 receives signals representing the light intensities of the beams measured by the photodetector 6 and the photodetector 7 from the photodetector 6 and the photodetector 7, respectively. The signal processing circuit 8 measures the rotational angle of the polarization plane of the laser beam based on the signals thus received. The rotational angle of the polarization plane is expressed by a function based on the intensity of the magnetic field in the propagation direction of the laser beam (see, e.g., Formula (2) described in D. Budker and five others, "RESONANT NONLINEAR MAGNETO-OPTICAL EFFECTS IN ATOMS," Reviews of Modern Physics, US, American Physical Society, October 2002, Vol. 74, No. 4, pp. 1153-1201. Although Formula (2) relates to the linear optical rotation, substantially the same formula can be used in the case of NMOR). The signal processing circuit 8 measures the intensity of the magnetic field in the propagation direction of the laser beam based on the rotational angle of the polarization plane. The display device 9 displays the intensity of the magnetic field measured by the signal processing circuit 8.

Subsequently, a configuration of the gas cell according to the first embodiment and an ampule used in the gas cell will be described with reference to FIG. 2, FIG. 3, FIG. 4, FIG. 5, and FIG. 6.

Configuration of Gas Cell

Figure 2:
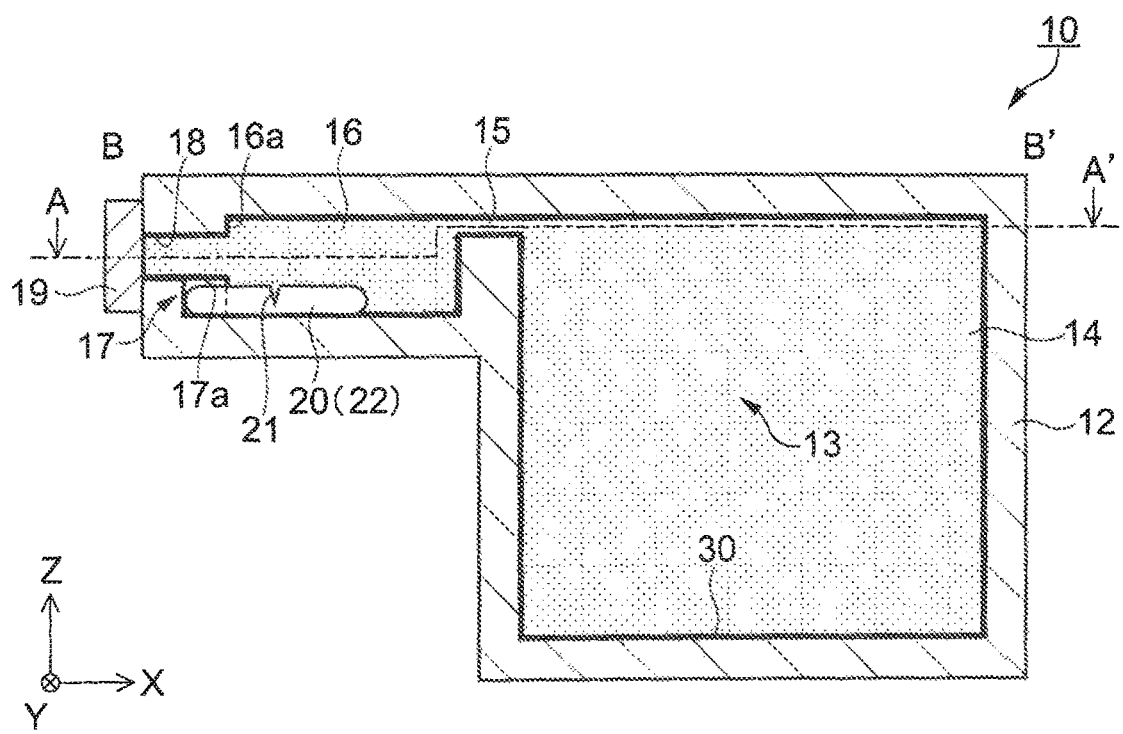
FIG. 2 is a side cross-sectional view of a gas cell according to a first embodiment of the invention along the longitudinal direction of the gas cell.
Figure 3:
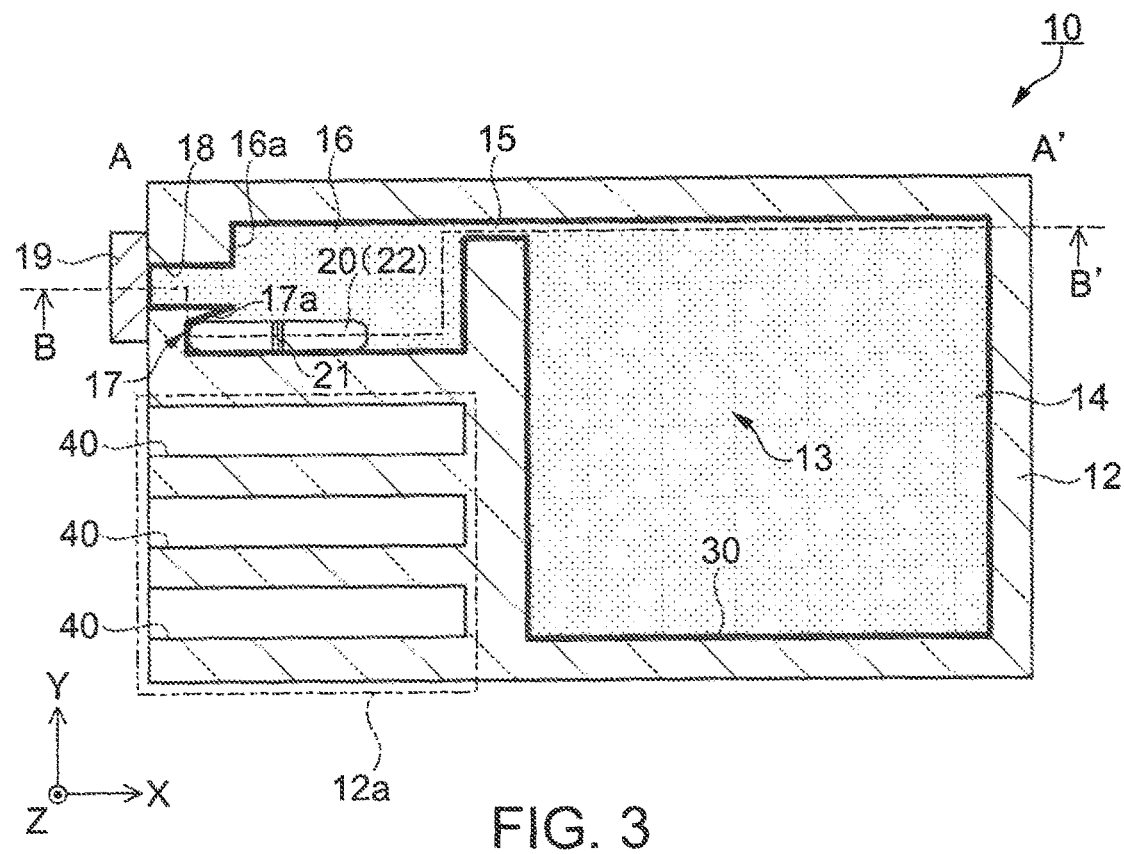
FIG. 3 is a planar cross-sectional view along the line A-A' shown in FIG. 2.
Figure 4:
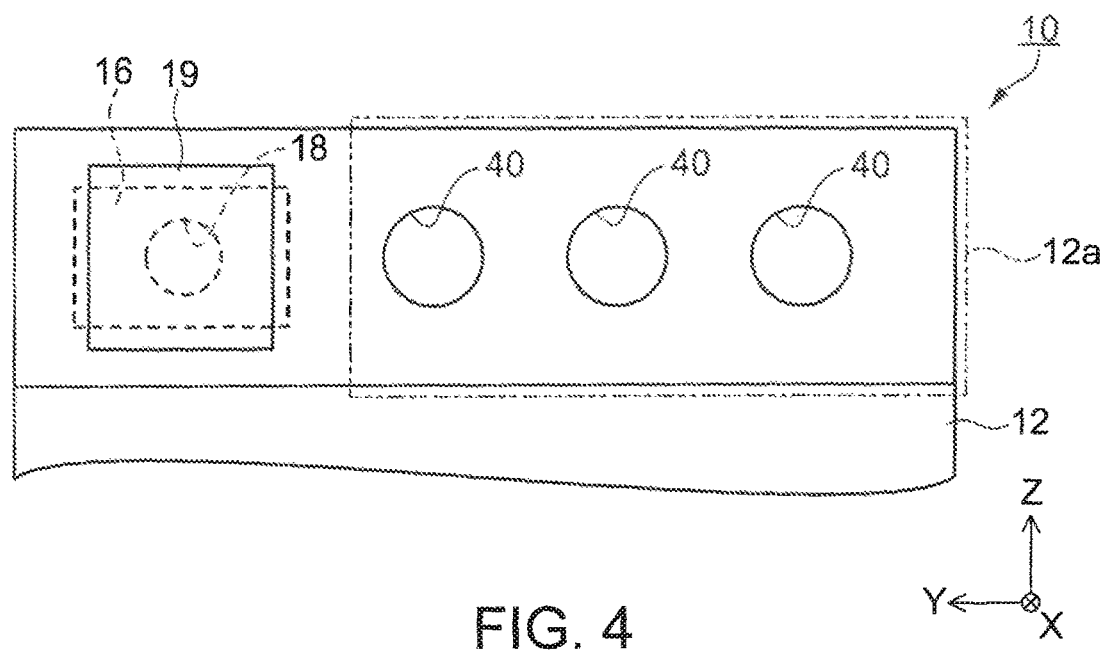
FIG. 4 is a side view of the gas cell according to the first embodiment viewed from a sealing section of the gas cell.

FIG. 2 is a side cross-sectional view of the gas cell according to the first embodiment along the longitudinal direction of the gas cell. FIG. 3 is a planar cross-sectional view along the line A-A' shown in FIG. 2. FIG. 4 is a side view of the gas cell according to the first embodiment viewed from a sealing section of the gas cell.

In FIG. 2, FIG. 3, and FIG. 4, the height direction (a vertical direction in FIG. 2) of the gas cell 10 is defined as a Z axis, and an upper side is defined as a +Z direction. A direction, which crosses the Z axis, and is the longitudinal direction (a horizontal direction in FIG. 2) of the gas cell 10, is defined as an X axis, and a rightward direction is defined as a +X direction. Further, a direction, which crosses the Z axis and the X axis, and is the width direction (a horizontal direction in FIG. 4) of the gas cell 10, is defined as a Y axis, and a leftward direction is defined as a +Y direction.

As shown in FIG. 2 and FIG. 3, the gas cell 10 according to the first embodiment is constituted by a cell 12 and a sealing section 19. The cell 12 is a box (cell) having voids inside, and is formed of, for example, a glass plate made of quartz glass. The thickness of the glass plate constituting the cell 12 is in a range of 1 mm through 5 mm, and is, for example, about 1.5 mm.

The cell 12 has a principal chamber 14 as a first chamber and a reservoir 16 as a second chamber as the internal voids. The principal chamber 14 and the reservoir 16 are disposed so as to be arranged along the X-axis direction as a first direction. The reservoir 16 has a longitudinal direction along the X-axis direction (the first direction). Further, the X-axis direction in which the principal chamber and the reservoir 16 are arranged corresponds to the longitudinal direction of the gas cell 10 (the cell 12). The principal chamber 14 and the reservoir 16 communicate with each other via a communication hole 15.

It should be noted that in FIG. 2, the line A-A' is a line passing through the center of an opening section 18, the reservoir 16, the center of the communication hole 15, and the principal chamber 14 along the X-axis direction. It FIG. 3, the line B-B' is a line passing through the center of the opening section 18, the reservoir 16, the center of an ampule 20, the center of the communication hole 15, and the principal chamber 14 along the X-axis direction. FIG. 2 is a cross-sectional view of the cross-section along the line B-B' shown in FIG. 3 viewed from the −Y direction side, and FIG. 3 is a cross-sectional view of the cross-section along the line A-A' shown in FIG. 2 viewed from the +Z direction side.

On the opposite side (the −X direction side) in the longitudinal direction of the reservoir 16 to the principal chamber 14 and the communication hole 15, there is disposed the opening section 18. The opening section 18 is sealed by the sealing section 19, and thus, the cell 12 (the principal chamber 14 and the reservoir 16) is sealed. As a material of the sealing section 19, there is used, for example, quartz glass. The sealing section 19 is fixed to the cell 12 via, for example, low-melting-point glass frit (not shown) disposed on the periphery of the opening section 18.

The principal chamber 14 and the reservoir 16 are filled with a gas (hereinafter referred to as an alkali metal gas) 13 of vapor of the alkali metal such as cesium. It is also possible for an inert gas such as a rare gas to exist in the principal chamber 14 and the reservoir 16 besides the alkali metal gas 13.

On the inside wall of the principal chamber 14 (and the reservoir 16), there is disposed a coating material film 30 as a film made of a coating material. The coating material film 30 has a function of inhibiting or reducing the variation of the behavior (e.g., spin) when the excited alkali metal atoms directly collide with the inside wall of the cell 12 (the principal chamber 14). The coating material film 30 is formed of chain saturated hydrocarbon such as paraffin. As an example of the paraffin, there can be used, for example, pentacontane expressed by the chemical formula ($CH_3(CH_2)_{48}CH_3$). The method of forming the coating material film 30 will be described later.

In the reservoir 16, there is housed the ampule 20. A glass tube 22 of the ampule 20 is provided with a through hole (an opening section) 21. The alkali metal gas 13 is the alkali metal, which is encapsulated in the ampule 20 (the glass tube 22), and evaporates and then flows out from the through hole 21. A configuration of the ampule 20 and a method of generating the alkali metal gas 13 will be described later.

In FIG. 2 and FIG. 3, there is shown an example in which a holding section 17 is disposed in the reservoir 16 along the X-axis direction as the longitudinal direction. The holding section 17 is formed of a recessed section recessed toward the −X direction along the longitudinal direction from the wall surface 16a of the inside wall on the side (−X direction side) on which the opening section 18 of the reservoir 16 is disposed. A tilted surface 17a (a step part) between the wall surface 16a and the holding section 17 (a recessed section) functions as a barrier for partitioning the holding section 17 in the reservoir 16. The ampule 20 is disposed so that the tip part thereof on the −X direction side is fit into the holding section 17. Thus, the ampule 20 is held by the holding section 17 in the reservoir 16.

It should be noted that the holding section 17 is not an essential constituent for the cell 12, it is also possible to adopt a configuration in which the holding section 17 is not disposed in the reservoir 16. However, if the holding section 17 is provided in the reservoir 16, it is possible to prevent the ampule 20 from getting out of the reservoir 16 through the opening section 18 in the handling in the manufacturing process of the gas cell 10 described later. Then, it is possible to prevent the ampule 20 from varying in position or moving in the reservoir 16 when providing the through hole 21 to the ampule 20 (the glass tube 22).

As shown in FIG. 3, the width (the length in the Y-axis direction) of the reservoir 16 is smaller than the width of the principal chamber 14, but in the width of the cell 12, the part of the side (the −X direction side) where the reservoir 16 is located and the part of the side (the +X direction side) where the principal chamber 14 is located are equal to each other. The cell 12 has a reinforcement section 12a extending from the reservoir 16 side (the −X direction side) of the principal chamber 14 in the X-axis direction along the reservoir 16.

If the cell 12 does not have the reinforcement section 12a, the width of the part of the cell 12 on the side where the reservoir 16 is located becomes smaller than the part on the side where the principal chamber 14 is located. Therefore, if force is applied to the cell 12 from the principal chamber 14 side (the +X direction side) along the longitudinal direction (the X-axis direction), there is a possibility that the force is concentrated on and damages the part where the reservoir 16 is located. Further, in the case in which force is applied to the cell 12 from the direction (e.g., the Y-axis direction) crossing the longitudinal direction, there is also a possibility that the part of the cell 12 where the reservoir 16 is located is damaged. In the present embodiment, since the cell 12 has the reinforcement section 12a, there is prevented the damage of the cell 12 due to the force applied along the longitudinal direction and the force applied in the direction crossing the longitudinal direction.

The reinforcement section 12a is provided with a plurality of holes 40 extending along the X-axis direction. Since the holes 40 are provided to the reinforcement section 12a, it is possible to reduce the substantive volume of the cell 12 in the reinforcement section 12a, in other words, the density of the constituent material of the cell 12 per unit volume of the reinforcement section 12a, can be reduced compared to the case in which the holes 40 are not provided.

Therefore, the difference in heat capacity between the wall of the principal chamber 14 on the reservoir 16 side and other walls of the principal chamber 14 can be reduced compared to the case in which the holes 40 are not provided. Further, in the part of the wall of the principal chamber 14 on the reservoir 16 side, the difference in heat capacity between the side (the +Y direction side) on which the reservoir 16 is located and the side (the −Y direction side) on which the reinforcement section 12a is located can be made small. Further, in the part of the wall of the principal chamber 14 on the reservoir 16 side, deviation in weight in the Y-axis direction can be reduced. Thus, it is possible to prevent the variation of the film thickness of the coating material film 30 and the lumps of the coating material from occurring when forming the coating material film 30 on the inside wall of the principal chamber 14 in the manufacturing process of the gas cell 10 described later.

FIG. 4 is a side view of the gas cell 10 viewed from the −X direction side in the longitudinal direction. As shown in FIG. 4, the opening section 18 has, for example, a circular shape. The inside diameter of the opening section 18 is, for example, in a range of about 0.4 mm through 1.5 mm. The sealing section 19 has, for example, a rectangular shape, but can also have other shapes such as a circular shape. The plurality of holes 40 provided to the reinforcement section 12a is disposed so as to be arranged along the Y-axis direction, for example. The holes 40 each have, for example, a circular shape, but can also have other shapes such as a rectangular shape. It should be noted that the number, the size (the diameter), the length (the length along the X-axis direction in FIG. 3) of the holes 40 are appropriately set in accordance with the size of the reinforcement section 12a, namely the width of the cell 12 and the size (the width, the length) of the reservoir 16, and so on.

Configuration of Ampule

Figure 5:
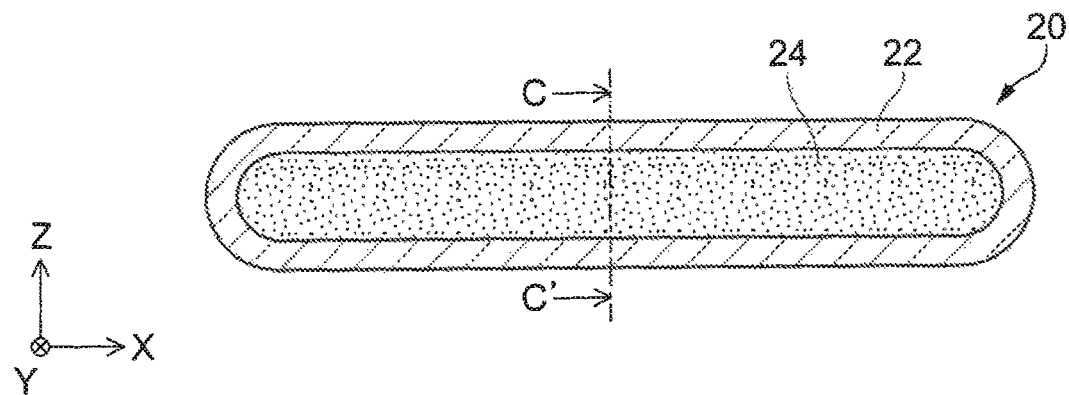
FIG. 5 is a cross-sectional view of an ampule according to the first embodiment along the longitudinal direction of an ampule.
Figure 6:
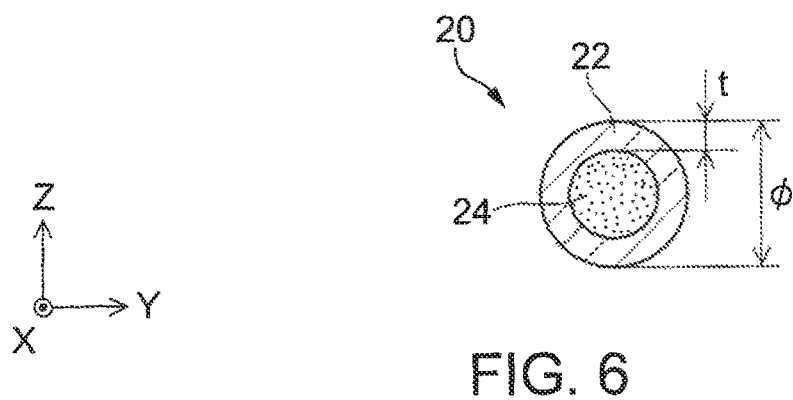
FIG. 6 is a schematic cross-sectional view along the line C-C' shown in FIG. 5.

FIG. 5 is a cross-sectional view of the ampule according to the first embodiment along the longitudinal direction of the ampule. FIG. 6 is a schematic cross-sectional view along the line C-C' shown in FIG. 5. As shown in FIG. 5, the ampule 20 as a solid substance including the alkali metal according to the first embodiment has a longitudinal direction. FIG. 5 shows an X-Z cross-section in the case of disposing the ampule 20 so that the longitudinal direction of the ampule 20 is parallel to the X-axis direction. The ampule 20 is formed of the glass tube 22 which is hollow. The glass tube 22 is formed of, for example, borosilicate glass.

The glass tube 22 extending along one direction (the X-axis direction in FIG. 5) and are welded at both end parts. Thus, the glass tube 22, which is hollow, is sealed. It should be noted that the shapes of the both end parts of the glass tube 22 are not limited to a rounded shape as shown in FIG. 5, but can also be a shape similar to a plane, a shape with a sharp part, and so on. The inside of the hollow of the glass tube 22 is filled with an alkali metal solid (e.g., granular or powdery alkali metal atoms) 24. As the alkali metal solid 24, there can be used rubidium, potassium, or sodium besides cesium as described above.

FIG. 5 shows the state in which the ampule 20 (the glass tube 22) is sealed. Although the glass tube 22 is in the sealed state in the stage in which the ampule 20 is manufactured, the through hole 21 (see FIG. 2) is provided to the glass tube 22 to break the seal in the stage in which the gas cell 10 is completed. Thus, the alkali metal solid 24 in the ampule 20 evaporates and flows out to the inside of the gas cell 10, and thus, the voids of the cell 12 is filled with the alkali metal gas 13 (see FIG. 2). It should be noted that between the upper surface of the ampule 20 and the inner surface of the cell 12, there is provided a gap of about 1.5 mm in, for example, +Z direction (see FIG. 2) so that the alkali metal solid 24 becomes easy to evaporate and flow out from the ampule 20.

FIG. 6 shows a Y-Z cross-section in the direction of crossing the longitudinal direction of the ampule 20. The Y-Z cross-sectional shape of the glass tube 22 is, for example, a roughly circular shape as shown in FIG. 6, but can also be other shapes. The outside diameter $\phi$ of the glass tube 22 fulfills 0.2 mm≤$\phi$≤1.2 mm. The wall thickness t of the glass tube 22 fulfills 0.1 mm≤$\phi$≤0.5 mm, and is preferably about 20% of the outside diameter $\phi$. If the wall thickness t of the glass tube 22 is smaller than 0.1 mm, the glass tube 22 becomes easy to break, and if the wall thickness t of the glass tube 22 exceeds 0.5 mm, it becomes difficult to process (the details will be described later) the glass tube 22 to form the through hole 21.

Method of Manufacturing Gas Cell

Then, a method of manufacturing the gas cell according to the first embodiment will be described with reference to FIG. 7, FIG. 8, FIG. 9, FIG. 10, FIG. 11, FIG. 12, and FIG. 13. FIG. 7, FIG. 8, FIG. 9, FIG. 10, FIG. 11, FIG. 12, and FIG. 13 are diagrams for describing the method of manufacturing the gas cell according to the first embodiment. It should be noted that FIG. 7, FIG. 8, FIG. 9, FIG. 11, FIG. 12, and FIG. 13 are each a side cross-sectional view corresponding to FIG. 2, and FIG. 10 is a planar cross-sectional view corresponding to FIG. 3.

Figure 7:
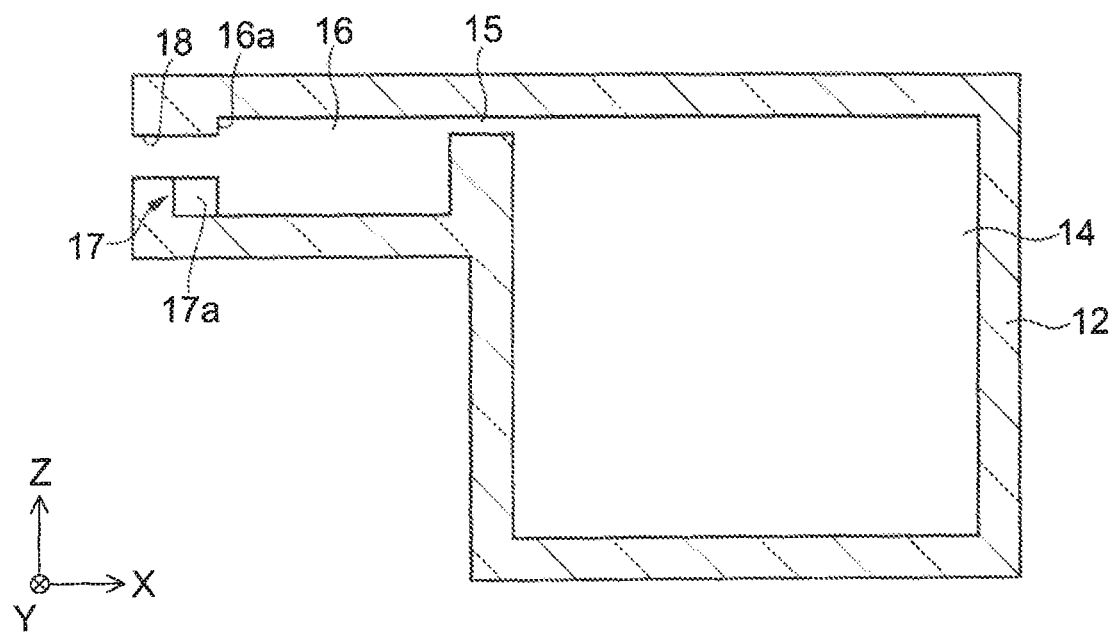
FIG. 7 is a diagram for explaining a method of manufacturing the gas cell according to the first embodiment.

Firstly, the cell 12 shown in FIG. 7 is prepared. Although not shown in the drawings, for example, the glass plate made of quartz glass is cut to prepare the glass plate members corresponding to the respective wall surfaces constituting the cell 12. Then, these glass plate members are assembled and are then bonded to each other with an adhesive or welding to obtain the cell 12 having such a principal chamber 14 and such a reservoir 16 as shown in FIG. 7. Although not shown in FIG. 7, the cell 12 has the reinforcement section 12a in a part of the principal chamber 14, which is located on the reservoir 16 side, and is located on the side crossing the longitudinal direction of the reservoir 16 (see FIG. 3).

In this stage, the opening section 18 of the cell 12 is opened. It should be noted that the description is presented here taking the case in which the holding section 17 is disposed in the reservoir 16 as an example. The holding section 17 can be configured by, for example, processing the glass plate member for constituting the cell 12 to form a recessed part and a tilted surface 17a.

Figure 8:
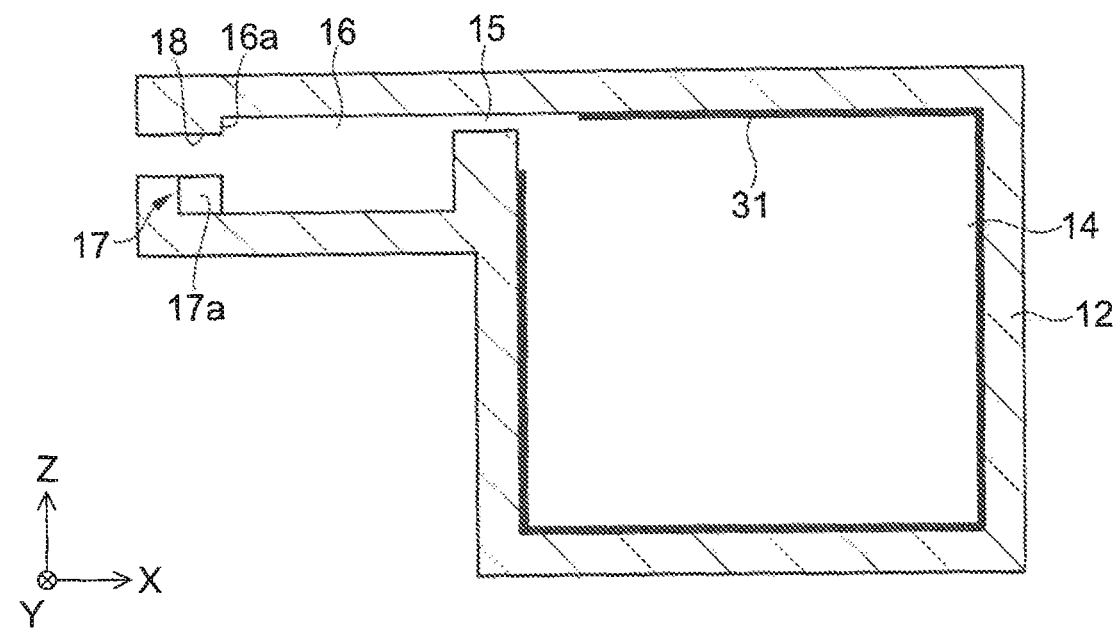
FIG. 8 is a diagram for explaining the method of manufacturing the gas cell according to the first embodiment.

Subsequently, under the hypobaric environment, the cell 12 is heated to thereby degas the principal chamber 14 and the reservoir 16 of the cell 12. Then, as shown in FIG. 8, a coating material 31 is introduced into the principal chamber 14 of the cell 12. The coating material 31 can also be introduced directly into the principal chamber 14 using a needle or the like. In that case, it is also possible to assume that the coating material 31 is disposed in a part of the inside of the principal chamber 14. Further, it is possible to dispose a tube-like member filled with the coating material 31 in the reservoir 16, and heat the tube-like member (or the whole of the cell 12) to evaporate the coating material 31 to introduce the coating material 31 into the principal chamber 14.

Figure 9:
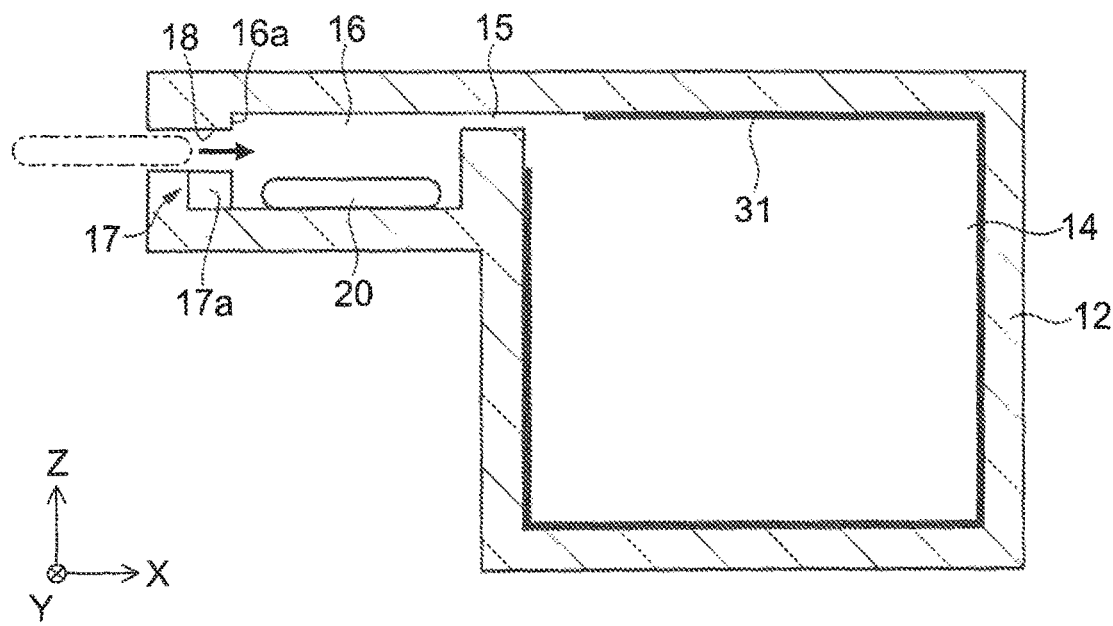
FIG. 9 is a diagram for explaining the method of manufacturing the gas cell according to the first embodiment.
Figure 10:
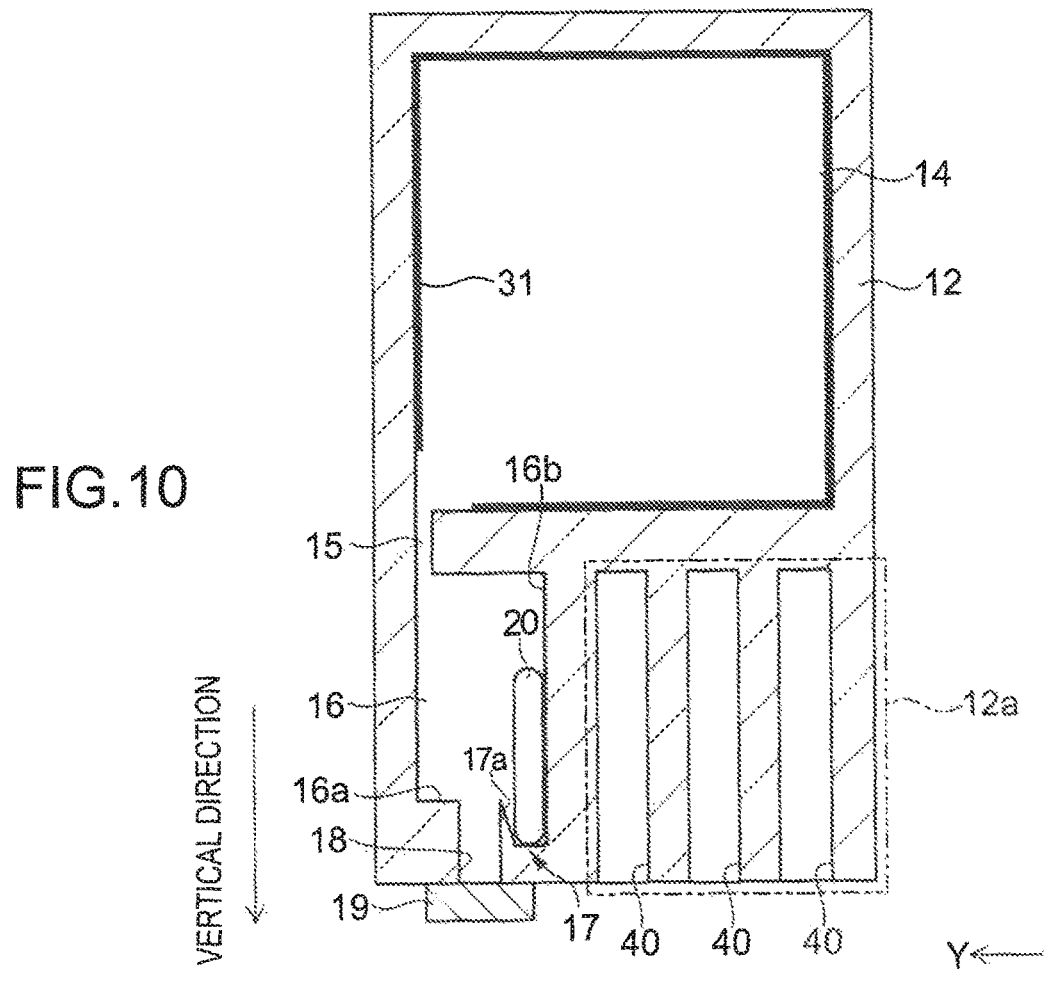
FIG. 10 is a diagram for explaining the method of manufacturing the gas cell according to the first embodiment.

Subsequently, as shown in FIG. 9, the ampule 20 is disposed in the reservoir 16 of the cell 12. As indicated by an arrow in FIG. 9, the ampule 20 is inserted into the reservoir 16 through the opening section 18 provided to the reservoir 16 of the cell 12 along the longitudinal direction (the X-axis direction). The ampule 20 is inserted into the reservoir 16 so that the longitudinal direction of the ampule 20 becomes parallel to the longitudinal direction (the X-axis direction) of the reservoir 16.

In the case in which the holding section 17 is disposed in the reservoir 16, by inserting the ampule 20 into the reservoir 16, and then changing the posture of the cell 12, the ampule 20 is moved in the reservoir 16 to dispose the ampule 20 in the holding section 17. Since the tip of the ampule 20 is guided by the tilted surface 17a, it is possible to easily dispose the ampule 20 in the holding section 17. Further, in the state in which the ampule 20 is disposed in the holding section 17, since the tilted surface 17a functions as a barrier for partitioning the holding section 17 in the reservoir 16, it is possible to prevent the ampule 20 from getting out of the reservoir 16 through the opening section 18 when being handled in the manufacturing process.

It should be noted that in the stage up to the disposing process, the ampule 20 is in the state in which the glass tube 22 with a hollow is filled with the alkali metal solid 24 and is then sealed as shown in FIG. 5. The ampule 20 is formed by filling the hollow of the tube-like glass tube 22 with the alkali metal solid 24, and then welding to seal each of the end parts of the glass tube 22 under the hypobaric environment (ideally in vacuum) approximate to vacuum. The alkali metal such as cesium used as the alkali metal solid 24 is rich in reactivity, and cannot be handled in the air, and is therefore housed in the cell 12 in the state of being airtightly encapsulated in the ampule 20 under the hypobaric environment.

Subsequently, as shown in FIG. 10, the opening section 18 of the cell 12 is sealed (a sealing process) with the sealing section 19. In the sealing process, the degasification in the cell 12 is sufficiently performed, and in the state in which the extremely small amount of impurities exist in the internal voids, the cell 12 (the principal chamber 14, the communication hole 15 and the reservoir 16) is sealed. For example, under the hypobaric environment (ideally in vacuum) approximate to vacuum, the low-melting-point glass flit (not shown) is disposed in the periphery of the opening section 18 in at least one of the cell 12 and the sealing section 19, and then the cell 12 and the sealing section 19 are fixed to each other to seal the inside to thereby seal the cell 12.

When fixing the cell 12 and the sealing section 19 to each other in the sealing process, it is preferable to dispose the cell 12 on the sealing section 19 so that the longitudinal direction becomes parallel to the vertical direction, and at the same time the opening section 18 is located on the lower side in the vertical direction as shown in FIG. 10. By arranging the constituents in such a manner, by adhering the cell 12 and the sealing section 19 to each other with the load applied to the cell 12 located on the upper side while heating the low-melting-point glass flit from the side of the sealing section 19 located on the lower side in the vertical direction, it is possible to efficiently perform sealing.

Here, in the case in which the cell 12 does not have the reinforcement section 12a, since the load from the upper side where the principal chamber 14 is located is concentrated into the part where the reservoir 16 smaller in width than the principal chamber 14 located on the lower side is located, there is a possibility that the cell 12 is damaged. In the present embodiment, since the cell 12 is provided with the reinforcement section 12a, the load from the upper side is distributed in the reinforcement section 12a, and is not concentrated into the part where the reservoir 16 is located, and therefore, the damage of the cell 12 due to the load applied from the upper side is suppressed.

Further, since the reinforcement section 12a is provided with the plurality of holes 40, the deviation of the weight in the direction (the Y-axis direction) crossing the vertical direction can be reduced in the part located on the lower side of the cell 12 and where the reservoir 16 is located. Therefore, it is possible to hold the cell 12 in the stabled state. Further, since the holes 40 extend along the longitudinal direction of the cell 12 in the reinforcement section 12a, if the cell 12 is disposed so that the longitudinal direction is parallel to the vertical direction, it results that the holes 40 extend along the vertical direction. Therefore, since the parts in the periphery of the holes 40 and the parts between the holes 40 in the reinforcement section 12a extend along the vertical direction, the load from the upper side can be distributed in the lower side of the cell 12 compared to the case in which the holes 40 extend in a direction crossing the longitudinal direction.

It should be noted that in the case in which the holding section 17 is not provided to the reservoir 16, if the cell 12 is disposed in the sealing process so that the opening part 18 is located on the lower side in the vertical direction, there is a possibility that the ampule 20 gets out from the reservoir 16 through the opening section 18. In the present embodiment, since the ampule 20 is held by the holding section 17, even in the case in which the cell 12 is disposed in the sealing process so that the opening section 18 is located on the lower side, it is possible to prevent the ampule 20 from getting out of the reservoir 16 through the opening section 18.

Subsequently, the coating material 31 is formed on the inside wall of the principal chamber 14 to thereby form (a formation process) the coating material film 30. The formation process includes a heating process (shown in FIG. 11) for heating the cell 12 to evaporate the coating material 31 and a cooling process (shown in FIG. 12) for cooling the cell 12 after the heating process to form a film of the coating material 31.

Figure 11:
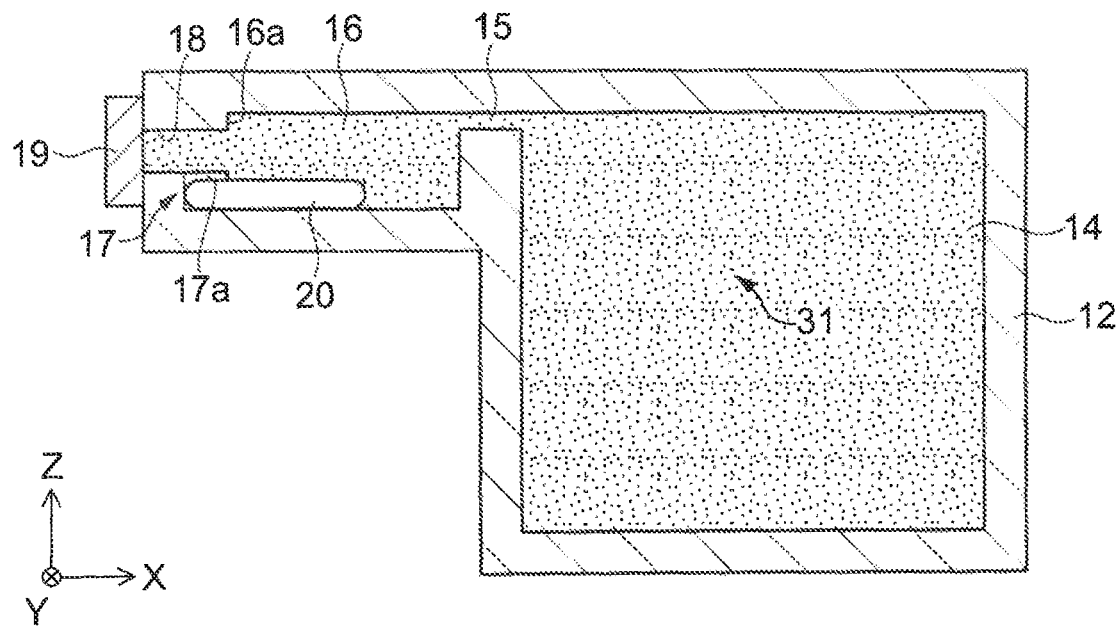
FIG. 11 is a diagram for explaining the method of manufacturing the gas cell according to the first embodiment.

In the heating process shown in FIG. 11, the cell 12 is heated by an oven or the like to evaporate the coating material 31 in the cell 12. Even in the case of disposing the coating material 31 in a part of the principal chamber 14, or in the case of disposing the tube-like member filled with the coating material 31 in the reservoir 16, the coating material 31 is heated to be evaporated by heating the whole of the cell 12, and the coating material 31 thus evaporated is dispersed in the entire space of the cell 12.

Figure 12:
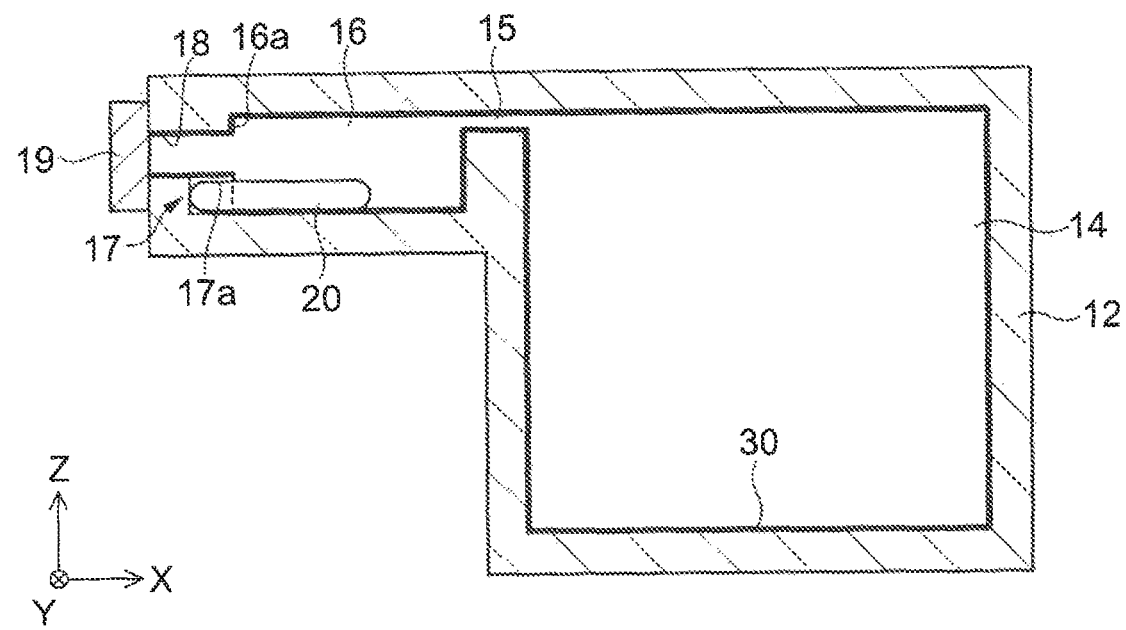
FIG. 12 is a diagram for explaining the method of manufacturing the gas cell according to the first embodiment.

In the cooling process shown in FIG. 12, the cell 12 is gradually cooled. Thus, the coating material film 30 is formed so as to cover the inside walls of the principal chamber 14 and the reservoir 16. In order to homogenize the film thickness of the coating material film 30 formed on the inside wall of the principal chamber 14, it is desirable for the walls surrounding the principal chamber 14 to decrease in temperature at the temperature equal between the walls when gradually cooling the cell 12.

However, the wall of the principal chamber 14 on the reservoir 16 side includes the reservoir 16 and the reinforcement section 12a, and is therefore larger in volume than other walls. Therefore, the heat capacity of the wall of the principal chamber 14 on the reservoir 16 side is higher than the heat capacity of other walls. In the cooling process, if the temperature difference occurs due to the difference in heat capacity between the wall of the principal chamber 14 on the reservoir 16 side and other walls, it results that the variation in film thickness of the coating material film 30, and drop-like lumps of the coating material 31 occur in the coating material film 30.

Here, in the present embodiment, since the holes 40 are provided to the reinforcement section 12a, it is possible to reduce the substantive volume of the reinforcement section 12a compared to the case in which the holes 40 are not provided, and thus, it is possible to reduce the substantive volume of the whole of the wall of the principal chamber 14 on the reservoir 16 side. Therefore, in the cooling process, it is possible to reduce the temperature difference caused by the difference in heat capacity between the wall of the principal chamber 14 on the reservoir 16 side and other walls. Thus, it is possible to prevent the variation in film thickness of the coating material film 30 formed on the inside walls of the principal chamber 14 and the lumps of the coating material 31 from occurring.

Figure 13:
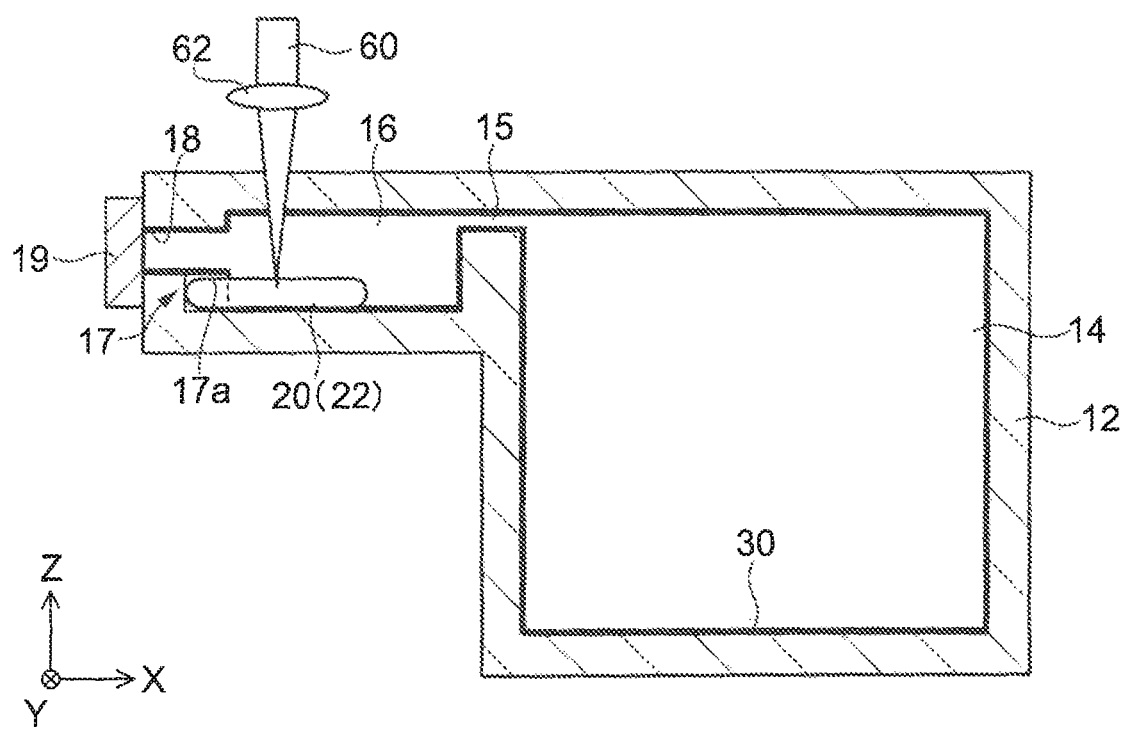
FIG. 13 is a diagram for explaining the method of manufacturing the gas cell according to the first embodiment.

Subsequently, as shown in FIG. 13, the glass tube 22 of the ampule 20 is irradiated with the pulse laser beam (laser beam) 60, which is collected by a collecting lens 62, via the cell 12 in between. The irradiation is performed with the pulse laser beam 60 so as to be focused on the upper surface of the ampule 20 (the glass tube 22). Thus, the through hole 21 (see FIG. 2) is provided to the glass tube 22, and the alkali metal solid 24 in the ampule 20 evaporates, and flows out to the voids of the gas cell 10. Since the laser beam is superior in directivity and convergent property, by performing the irradiation with the pulse laser beam 60, it is possible to easily provide the glass tube 22 with the through hole 21.

In this process, it is necessary to provide the through hole 21 to the glass tube 22 of the ampule 20 without damaging the cell 12. Therefore, in the case in which the cell 12 is formed of quartz glass, and the glass tube 22 is formed of borosilicate glass, for example, the pulse laser beam 60 with the wavelength in the ultraviolet region is used. The light with the wavelength in the ultraviolet region is transmitted through the quartz glass, but is slightly absorbed by the borosilicate glass. Thus, it is possible to selectively process the glass tube 22 of the ampule 20 to form the through hole 21 without damaging the cell 12.

The energy of the pulse laser beam 60 is set to, for example, 20 µJ/pulse through 200 µJ/pulse. The pulse width of the pulse laser beam 60 is set to, for example, 10 nanoseconds through 50 nanoseconds, and is preferably about 30 nanoseconds. The repeating frequency of the pulse laser beam 60 is set to, for example, about 50 kHz, and the irradiation time of the pulse laser beam 60 is set to, for example, about 100 milliseconds.

By providing the ampule 20 with the through hole 21, the seal of the ampule 20 is broken in the reservoir 16, and the alkali metal solid 24 evaporates and then flows out from the ampule 20 as the alkali metal gas 13. The alkali metal gas 13 having flown out in the reservoir 16 flows into the principal chamber 14 of the cell 12 through the communication hole 15, and is dispersed. As a result, as shown in FIG. 2, the voids of the cell 12 are filled with the alkali metal gas 13.

In order to surely provide the through hole 21 to the glass tube 22 of the ampule 20, it is preferable to set the irradiation position of the ampule 20 with the pulse laser beam 60 so that the focal point of the pulse laser beam 60 is located at the central part in the width direction (the Y-axis direction) of the ampule 20. If the focal point of the pulse laser beam 60 is shifted from the central part in the width direction of the ampule 20, the processing in the depth direction stops to make it unachievable to penetrate the glass tube 22 in some cases.

As in the present embodiment, if the holding section 17 is disposed in the reservoir 16, since the ampule 20 is held by the holding section 17 in the reservoir 16, it is possible to prevent the position of the ampule 20 from varying in the reservoir 16 and the ampule 20 from moving in handling. Therefore, the shift of the ampule 20 from the irradiation position with the pulse laser beam 60 is suppressed, and it is also prevented that the ampule 20 is moved due to an impact by the irradiation with the pulse laser beam 60. Thus, it is possible to stably and reliably provide the through hole 21 to the ampule 20 to generate the alkali metal gas 13, and therefore, it is possible to increase the productivity of the gas cell 10.

It should be noted that in the process of irradiating the ampule 20 with the pulse laser beam 60 to generate the alkali metal gas 13, it is sufficient to evaporate the alkali metal solid 24 to make the vapor flow out from the ampule 20 into the cell 12. Therefore, the formation of the through hole 21 is not limited to the method described above, but it is also possible to, for example, generate a crack in the glass tube 22 to break the ampule 20, or break the glass tube 22.

The gas cell 10 is completed by the process described above. According to the method of manufacturing the gas cell 10 according to the present embodiment, it is possible to prevent the variation in film thickness of the coating material film 30 formed on the inside walls of the principal chamber 14 and the lumps of the coating material 31 from occurring. Thus, it is possible to manufacture the gas cell 10 high in quality (e.g., sensitivity and measurement accuracy).

The method of manufacturing the magnetometric device 100 according to the present embodiment includes the method of manufacturing the gas cell 10 described above. In the processes of manufacturing the magnetometric device 100 according to the present embodiment, since a known method can be used in the processes other than the processes of manufacturing the gas cell 10, the description thereof will be omitted.

Second Embodiment

A second embodiment is different from the first embodiment in the point that grooves are provided to the reinforcement section, but is roughly the same as the first embodiment in the configuration of the cell. A configuration of the gas cell according to the second embodiment will be described with reference to FIG. 14. It should be noted that the constituents common to the first embodiment and the present embodiment are denoted by the same reference symbols, and the description thereof will be omitted.

Figure 14:
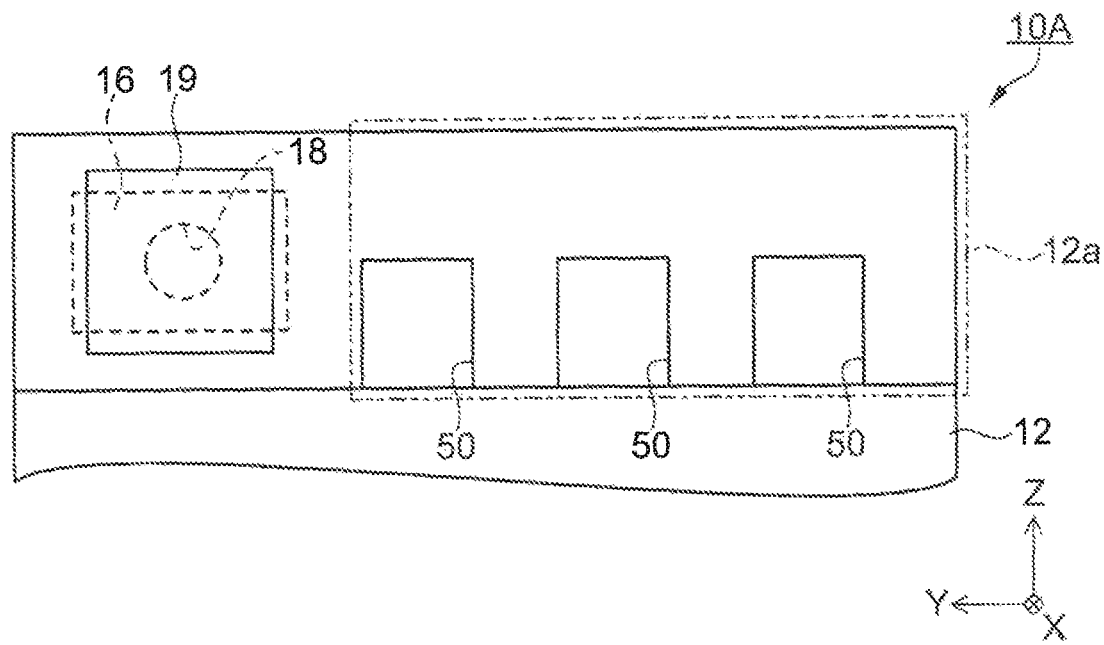
FIG. 14 is a side view of a gas cell according to a second embodiment of the invention viewed from a sealing section of the gas cell.

FIG. 14 is a side view of the gas cell according to the second embodiment viewed from the sealing section of the gas cell. FIG. 14 is a side view of the gas cell 10A according to the second embodiment viewed from the −X direction side in the longitudinal direction, and corresponds to FIG. 4 in the first embodiment. As shown in FIG. 14, in the gas cell 10A according to the second embodiment, the plurality of grooves 50 is provided to the reinforcement section 12a of the cell 12. Although not shown in the drawing, the grooves 50 are formed so as to extend along the longitudinal direction (the X-axis direction) of the cell 12 similarly to the holes 40 in the first embodiment (see FIG. 3).

In the gas cell 10A according to the second embodiment, since the grooves 50 are provided to the reinforcement section 12a of the cell 12, it is possible to reduce the substantive volume of the cell 12 in the reinforcement section 12a to thereby reduce the heat capacity of the wall of the cell 12 (the principal chamber 14) on the side (the −X direction side) on which the reservoir 16 is located compared to the case in which the grooves 50 are not formed. Therefore, substantially the same advantages as in the first embodiment can also be obtained in the second embodiment.

It should be noted that the grooves 50 shown in FIG. 14 are formed so as to be recessed from the surface of the reinforcement section 12a located on the −Z direction side, but can also be formed so as to be recessed from the surface of the reinforcement section 12a located on the +Z direction side. Further, the shape of each of the grooves 50 viewed from the −X direction side is, for example, a rectangular shape, but can also be other shapes such as a semicircular shape or a triangular shape.

Third Embodiment

A third embodiment is different from the first embodiment in the point that the holes provided to the reinforcement section are connected to each other, but is roughly the same as the first embodiment in the configuration of the cell. A configuration of the gas cell according to the third embodiment will be described with reference to FIG. 15. It should be noted that the constituents common to the first embodiment and the present embodiment are denoted by the same reference symbols, and the description thereof will be omitted.

Figure 15:
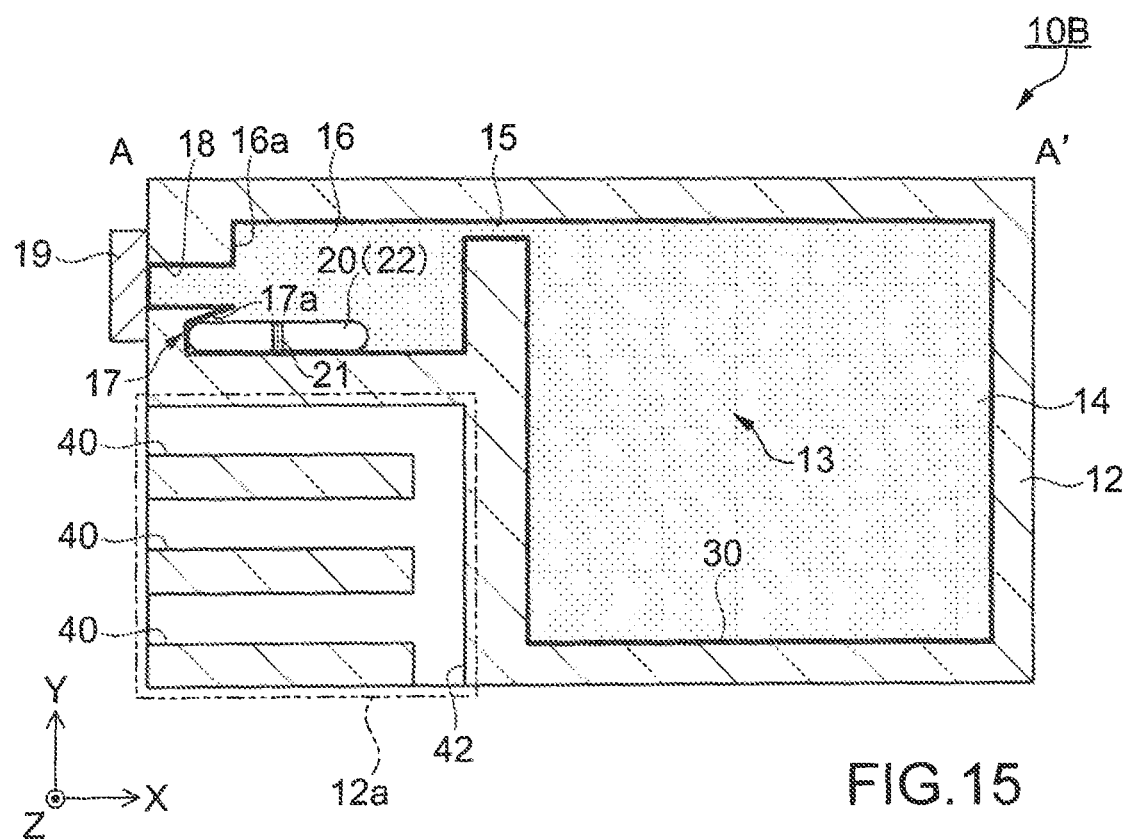
FIG. 15 is a planar cross-sectional view of a gas cell according to a third embodiment of the invention.

FIG. 15 is a planar cross-sectional view of the gas cell according to the third embodiment. FIG. 15 corresponds to FIG. 3 in the first embodiment. As shown in FIG. 15, in the gas cell 10B according to the third embodiment, the reinforcement section 12a of the cell 12 is provided with holes extending along a direction crossing the longitudinal direction of the cell 12 in addition to the plurality of holes 40 extending along the longitudinal direction (the X-axis direction) of the cell 12. The holes 42 are formed so as to extend along the Y-axis direction, and connect the plurality of holes 40 to each other.

In the gas cell 10B according to the third embodiment, it is possible to form a larger number of holes (the holes 42) without decreasing the intervals between the holes 40 adjacent to each other within the limited space of the reinforcement section 12a. Therefore, in the third embodiment, since the substantive volume of the cell 12 in the reinforcement section 12a can further be reduced, the heat capacity of the wall of the cell 12 (the principal chamber 14) on the side on which the reservoir 16 is located can further be reduced compared to the first embodiment. It should be noted that in the third embodiment, it is possible to adopt a configuration in which the grooves of the second embodiment are provided to the reinforcement section 12a instead of the holes 40, 42.

The embodiments described above are only for showing an aspect of the invention, and modifications and applications can arbitrarily be made within the scope or the spirit of the invention. As modified examples, those described below can be cited.

Modified Example 1

Figure 16:
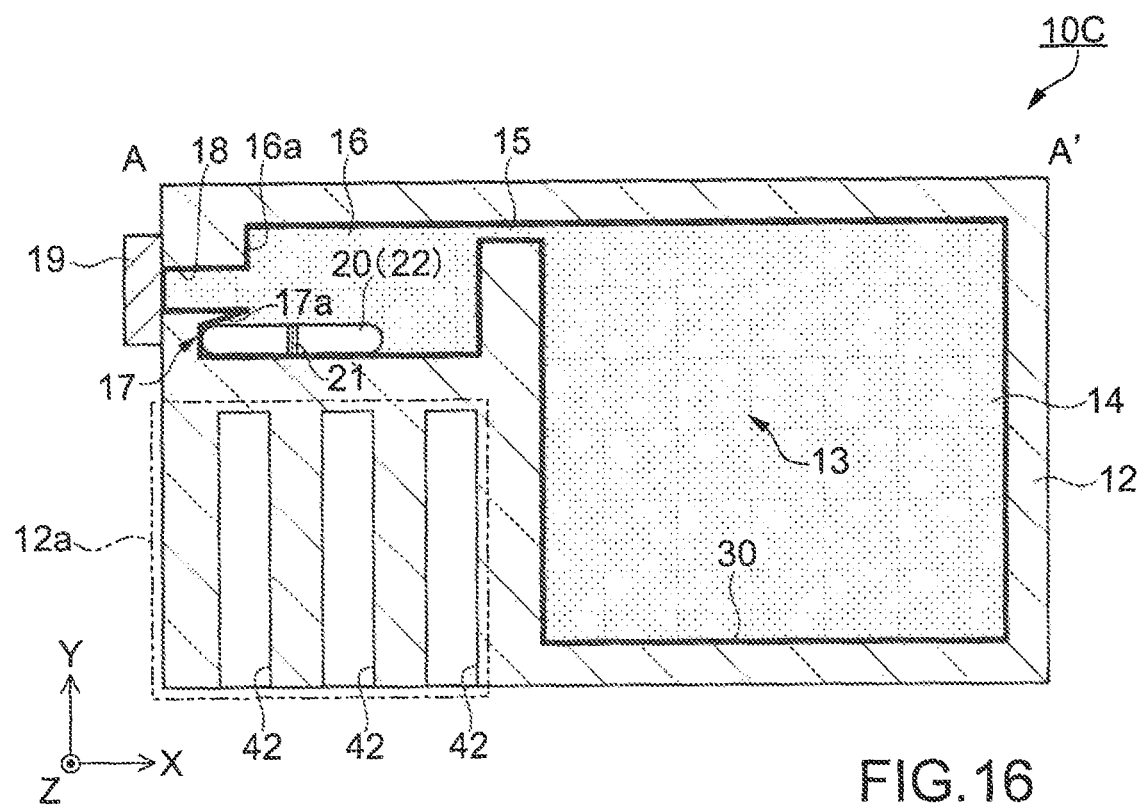
FIG. 16 is a planar cross-sectional view showing a configuration example of a gas cell according to Modified Example 1.

Although in the gas cell according to the embodiments described above, the reinforcement section is provided with the holes or the grooves extending along the longitudinal direction of the cell, the invention is not limited to such a configuration. It is also possible to adopt a configuration in which the holes or the grooves are formed so as to extend along a direction crossing the longitudinal direction of the cell. FIG. 16 is a planar cross-sectional view showing a configuration example of a gas cell according to Modified Example 1.

As shown in FIG. 16, in the gas cell 10C according to Modified Example 1, the reinforcement section 12a of the cell 12 is provided with a plurality of holes 42 extending along the direction (the Y-axis direction) crossing the longitudinal direction of the cell 12. It is also possible to form the grooves instead of the plurality of holes 42. According also to such a configuration, it is possible to reduce the substantive volume of the cell 12 in the reinforcement section 12a to thereby reduce the heat capacity of the wall of the cell 12 on the side on which the reservoir 16 is located.

Modified Example 2

Figure 17:
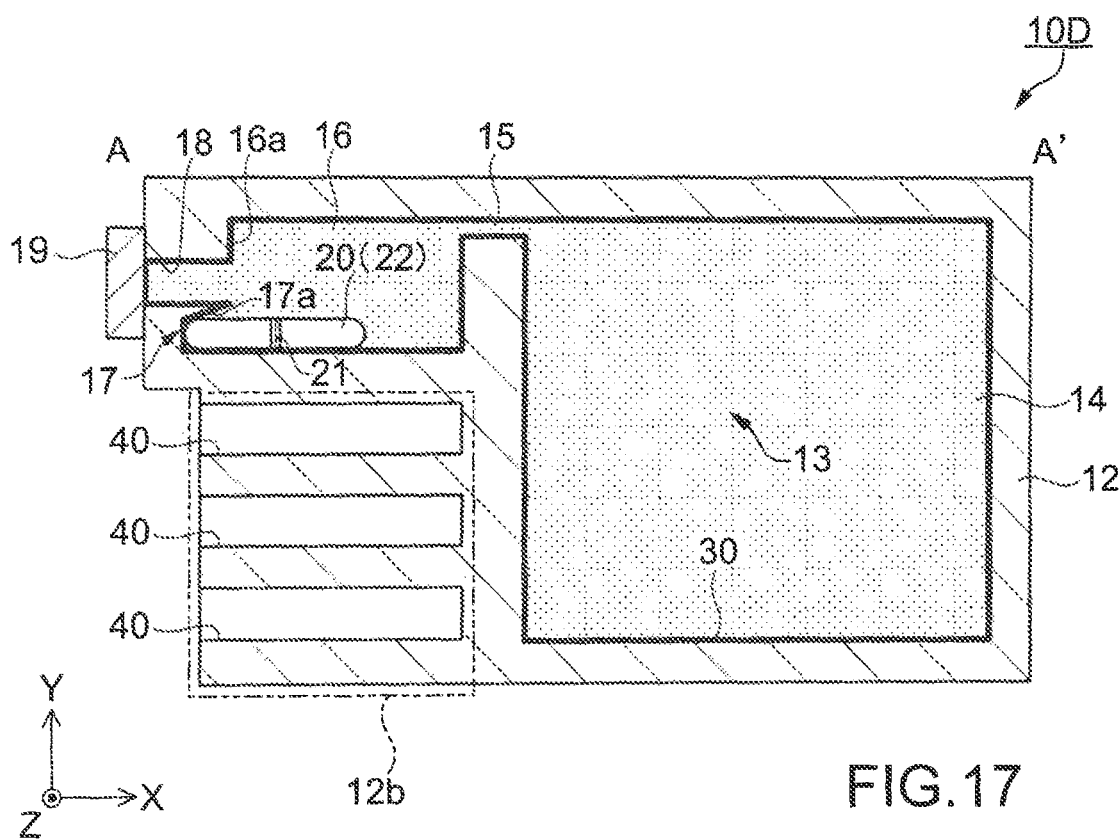
FIG. 17 is a planar cross-sectional view showing a configuration example of a gas cell according to Modified Example 2.
Figure 18:
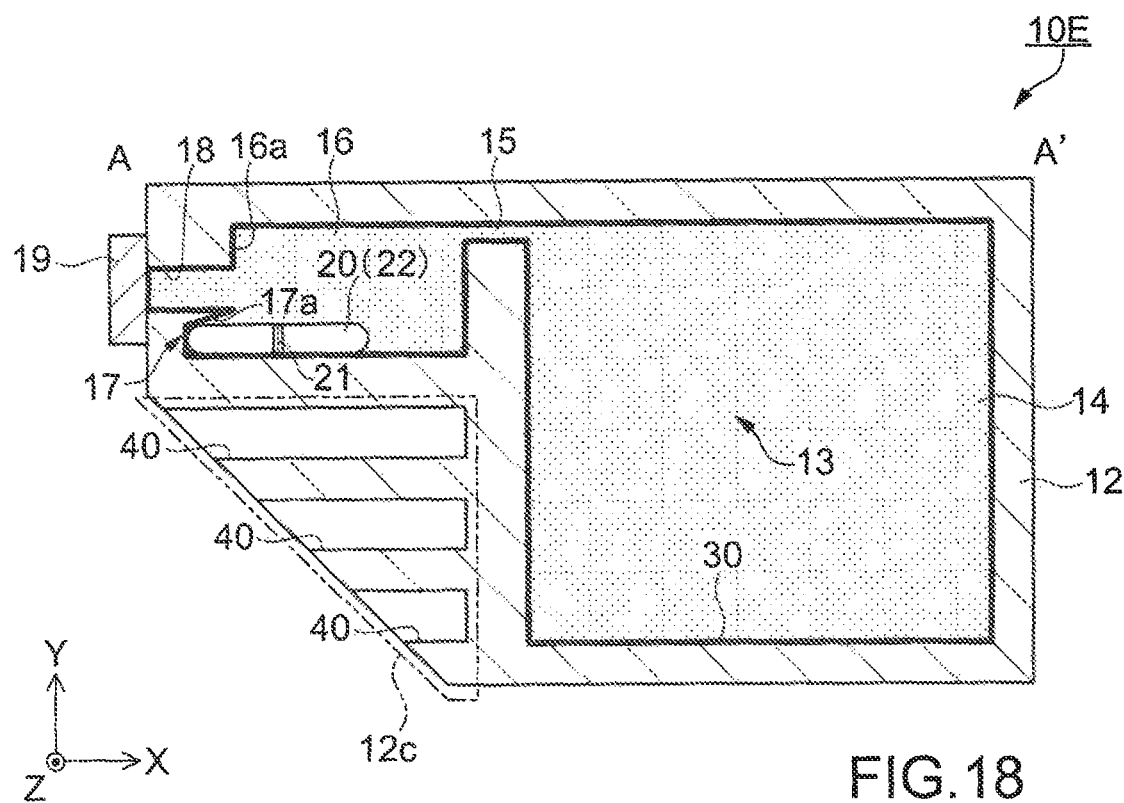
FIG. 18 is a planar cross-sectional view showing a configuration example of the gas cell according to Modified Example 2.

In the gas cell of the embodiments described above, the planar shape of the cell including the reinforcement section is a rectangular shape, and in the width and the length of the cell, the part with the reinforcement section and the part without the reinforcement section are equal to each other, but the invention is not limited to such a configuration. It is also possible to adopt a configuration in which the size and shape of the reinforcement section are different therebetween. FIG. 17 and FIG. 18 are each a planar cross-sectional view showing a configuration example of a gas cell according to Modified Example 2.

As shown in FIG. 17, in the gas cell 10D according to Modified Example 2, the reinforcement section 12b has a rectangular shape, but is smaller in plane area than the reinforcement section 12a of the embodiments described above. In the gas cell 10D, the end surface of the reinforcement section 12b on the −X direction side recedes toward the +X direction from the end surface of the outside wall of the reservoir 16 on the −X direction side. Further, as shown in FIG. 18, in the gas cell 10E according to Modified Example 2, the reinforcement section 12c has a triangular shape, and is smaller in plane area than the reinforcement section 12a of the embodiments described above. Therefore, in the gas cells 10D, 10E, since the volume of the whole of the reinforcement section 12b, 12c (including the plurality of holes 40) can be made smaller, the heat capacity of the wall of the cell 12 on the side on which the reservoir 16 is located can further be reduced.

Modified Example 3

Figure 19:
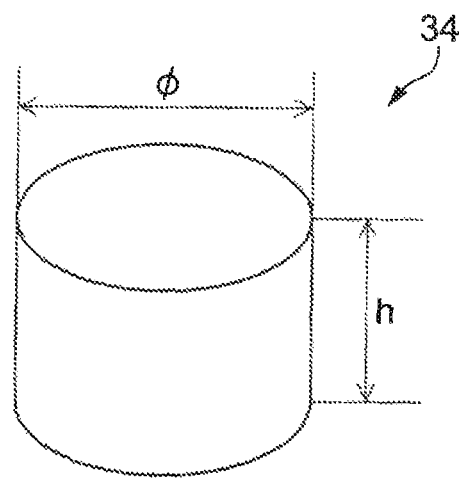
FIG. 19 is a perspective view of a pill according to Modified Example 3.
Figure 20:
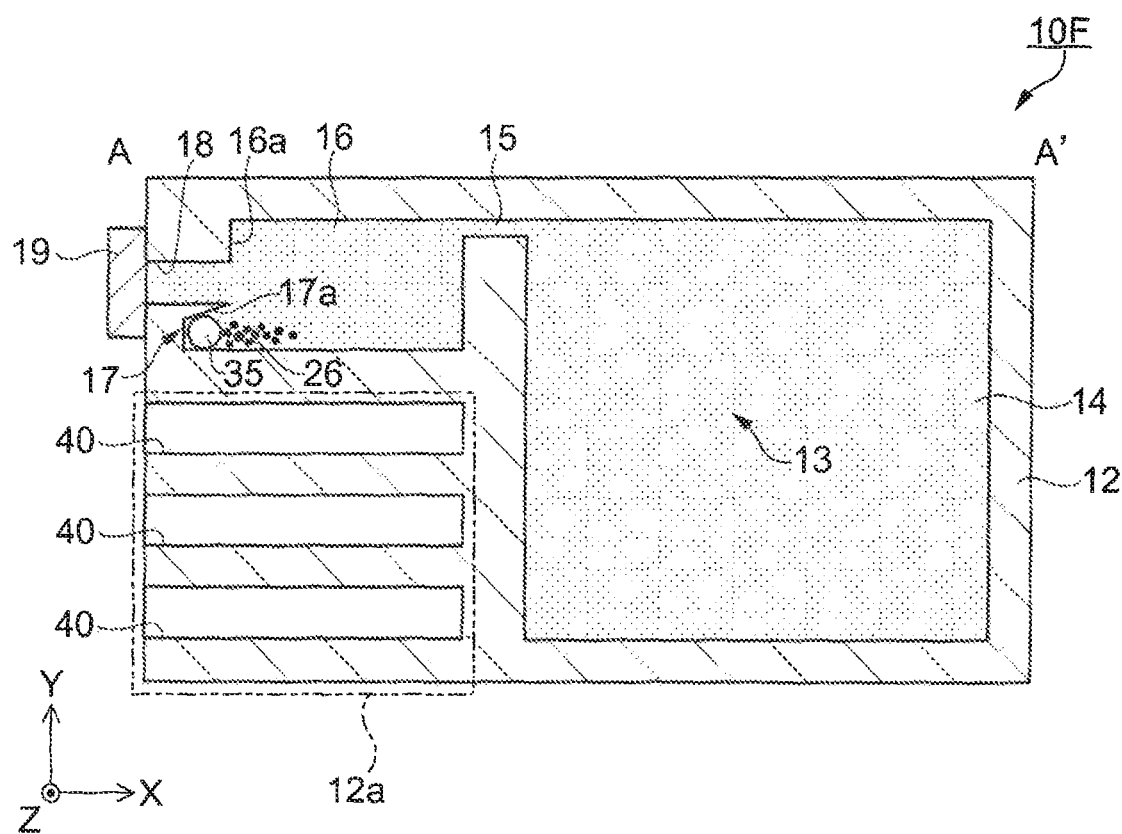
FIG. 20 is a planar cross-sectional view showing a configuration example of a gas cell according to Modified Example 3.

In the gas cell according to the embodiments described above, the solid substance including the alkali metal is the ampule, but the invention is not limited to such a configuration. It is also possible to adopt a configuration in which a pill is used as the solid substance including the alkali metal instead of the ampule. FIG. 19 is a perspective view of the pill according to Modified Example 3. FIG. 20 is a planar cross-sectional view showing a configuration example of a gas cell according to Modified Example 3.

As shown in FIG. 19, the pill 34 according to Modified Example 3 has, for example, a roughly cylindrical shape, but can also has other shapes such as a rectangular solid shape or a spherical shape. The pill 34 includes an alkali metal compound and an adsorbent. When irradiating the pill 34 with a continuous oscillation laser beam (laser beam) with a wavelength in a region from red through infrared, the alkali metal compound is activated to generate the alkali metal, and the impurities and impurity gas discharged on this occasion is adsorbed by the adsorbent. In the case of using cesium as the alkali metal, a cesium compound such as cesium molybdate or cesium chloride can be used as the alkali metal compound. As the adsorbent, there can be used, for example, a zirconium powder or aluminum.

As shown in FIG. 20, in the gas cell 10F according to Modified Example 3, in the completed state, the alkali metal 26 (e.g., cesium) is generated from the alkali metal compound of the pill 34 in the reservoir 16, and the principal chamber 14 and the reservoir 16 are filled with the alkali metal gas obtained by evaporating the alkali metal 26. It is acceptable that there remain the adsorbent 35 having adsorbed the impurity gas, the impurities, and so on.

Modified Example 4

Figure 21:
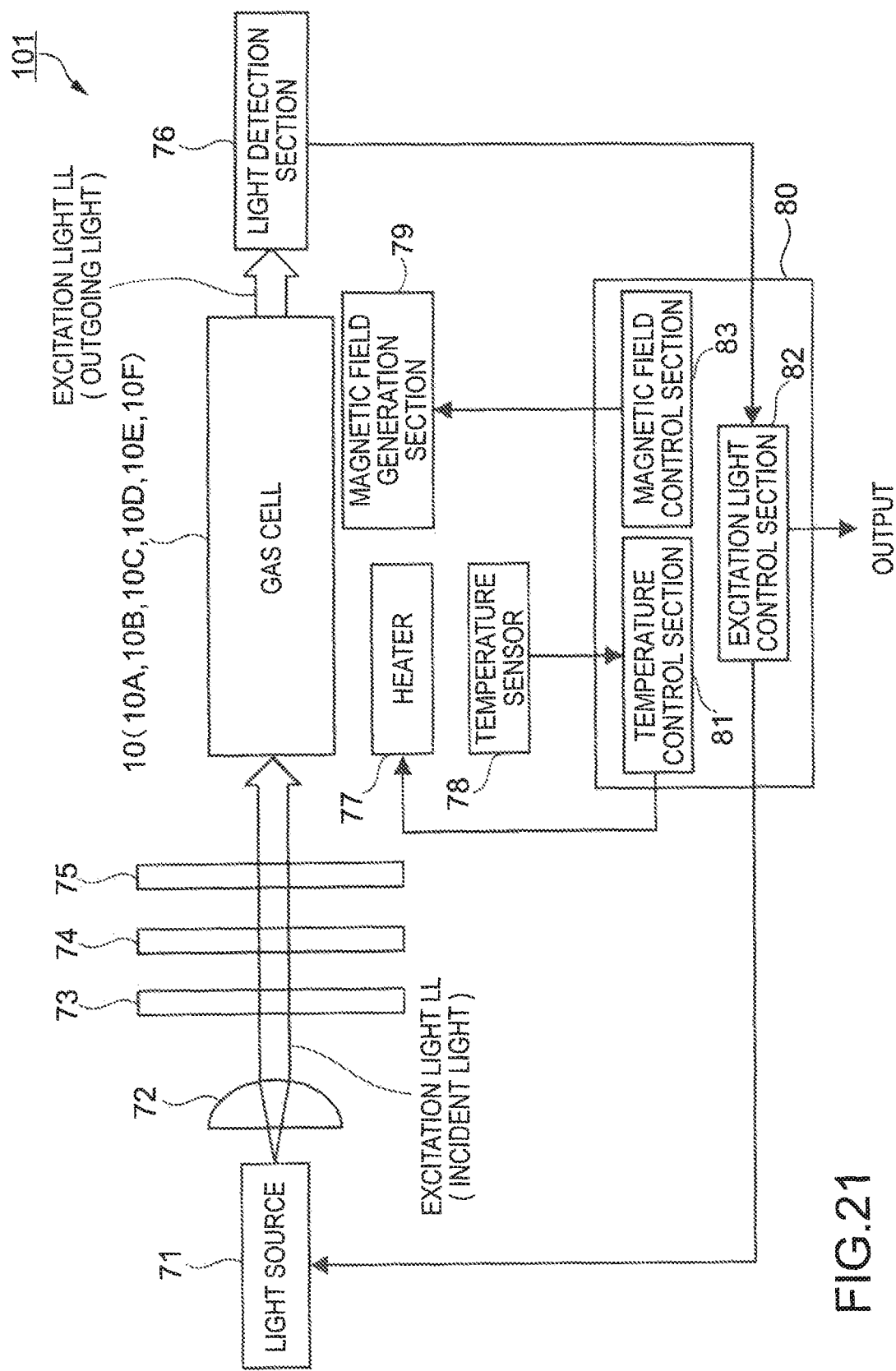
FIG. 21 is a schematic diagram showing a configuration of an atomic oscillator according to Modified Example 4.
Figure 22:
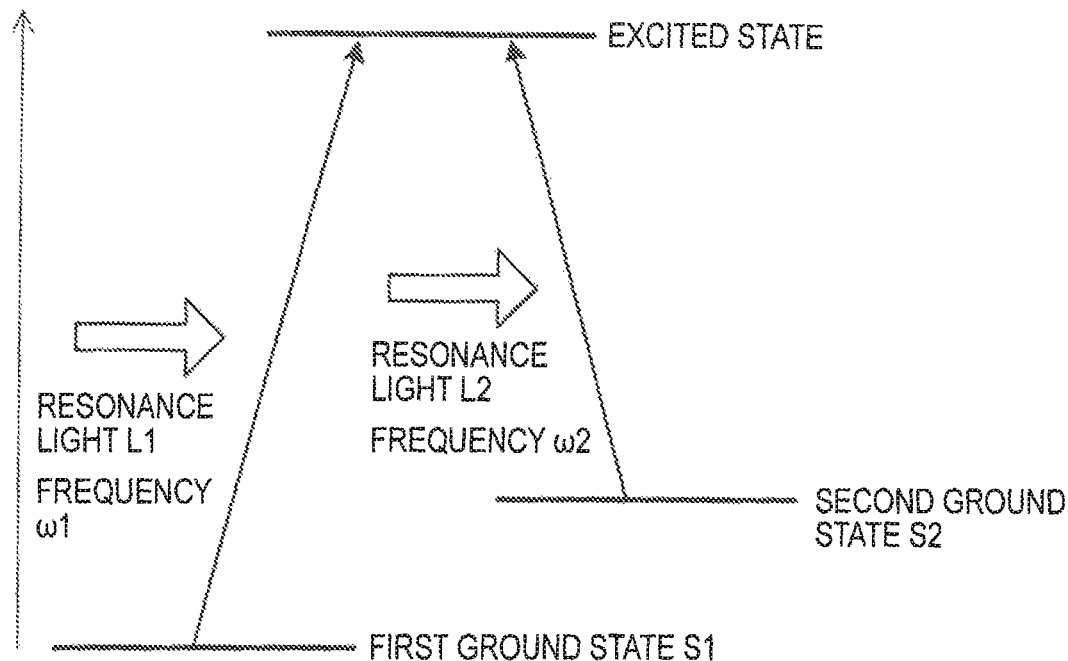
FIG. 22 is a diagram for explaining an operation of the atomic oscillator according to Modified Example 4.
Figure 23:
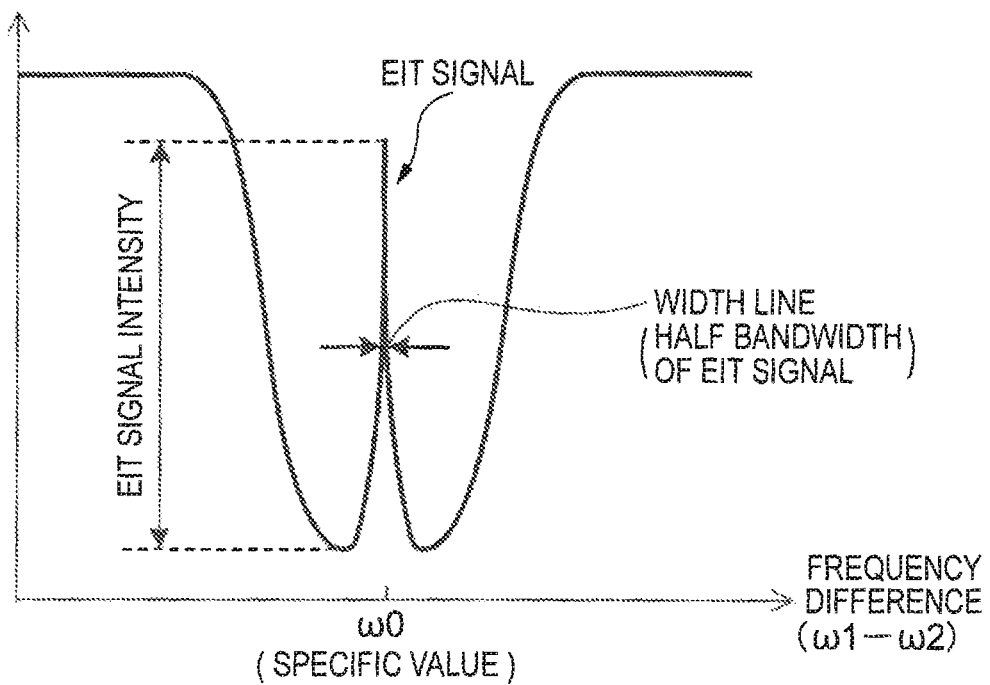
FIG. 23 is a diagram for explaining the operation of the atomic oscillator according to Modified Example 4.

The device, to which the gas cell according to any of the embodiments and modified examples described above can be applied, is not limited to the magnetometric device 100. The gas cell according to any of the embodiments and modified examples described above can also be applied to an atomic oscillator such as an atomic clock. FIG. 21 is a schematic diagram showing a configuration of an atomic oscillator according to Modified Example 4. Further, FIG. 22 and FIG. 23 are diagrams for explaining the operation of the atomic oscillator according to Modified Example 4.

The atomic oscillator (a quantum interference device) 101 according to Modified Example 4 shown in FIG. 21 is an atomic oscillator using coherent population trapping. As shown in FIG. 21, the atomic oscillator 101 is provided with the gas cell 10 (or any one of the gas cells 10A, 10B, 10C, 10D, 10E, and 10F) according to the embodiments described above, a light source 71, optical components 72, 73, 74, and 75, a light detection section 76, a heater 77, a temperature sensor 78, a magnetic field generation section 79, and a control section 80.

The light source 71 emits two types of light (resonance light L1 and resonance light L2 shown in FIG. 22) different in frequency from each other described later as excitation light LL for exciting the alkali metal atoms in the gas cell 10. The light source 71 is formed of, for example, a semiconductor laser such as a vertical cavity surface emitting laser (VCSEL). The optical components 72, 73, 74, and 75 are disposed on the optical path of the excitation light LL between the light source 71 and the gas cell 10, and are arranged in the order of the optical component 72 (a lens), the optical component 73 (a polarization plate), the optical component 74 (a dimming filter), the optical component 75 (a λ/4 wave plate) from the light source 71 side toward the gas cell 10.

The light detection section 76 detects the intensity of the excitation light LL (the resonance light L1 and the resonance light L2) having been transmitted through the gas cell 10. The light detection section 76 is formed of, for example, a solar cell, or a photodiode, and is connected to an excitation light control section 82 of the control section 80 described later. The heater 77 (a heating section) heats the gas cell 10 in order to keep the alkali metal in the gas cell 10 in the gaseous state (as the alkali metal gas 13). The heater 77 (the heating section) is formed of, for example, a heating resistor.

The temperature sensor 78 detects the temperature of the heater 77 or the gas cell 10 in order to control the amount of heat generation of the heater 77. The temperature sensor 78 is formed of a variety of types of known temperature sensors such as a thermocouple. The magnetic field generation section 79 generates the magnetic field for Zeeman-splitting the degenerate energy levels of the alkali metal in the gas cell 10. It is possible to enlarge the degenerate gap between the energy levels different from each other of the alkali metal using the Zeeman split to thereby improve the resolution. As a result, the accuracy of the oscillation frequency of the atomic oscillator 101 can be improved. The magnetic field generation section 79 is formed of, for example, a Helmholtz coil or a solenoidal coil.

The control section 80 has the excitation light control section 82 for controlling the frequency of the excitation light LL (the resonance light L1 and the resonance light L2) emitted by the light source 71, a temperature control section 81 for controlling energization of the heater 77 based on the detection result of the temperature sensor 78, and a magnetic field control section 83 for controlling the magnetic field generated by the magnetic field generation section 79 to be constant. The control section 80 is disposed in, for example, an IC chip mounted on a board.

The principle of the atomic oscillator 101 will briefly be described. FIG. 22 is a diagram for explaining the energy state of the alkali metal in the gas cell 10 of the atomic oscillator 101, and FIG. 23 is a graph showing a relationship between a frequency difference between the two types of light from the light source 71 of the atomic oscillator 101 and the detection intensity in the light detection section 76. As shown in FIG. 22, the alkali metal (the alkali metal gas 13) encapsulated in the gas cell 10 has energy levels of the three-level system, and can take three states, namely two ground states (a first ground state S1 and a second ground state S2) different in energy level from each other, and an excited state. Here, the first ground state S1 is an energy state lower than the second ground state S2.

When irradiating such an alkali metal gas 13 as described above with the two types of resonance light, namely the first resonance light L1 and the second resonance light L2, different in frequency from each other, the light absorptance (the light transmittance) of the first resonance light L1 and the second resonance light L2 in the alkali metal gas 13 varies in accordance with a difference ($\omega1-\omega2$) between the frequency $\omega1$ of the first resonance light L1 and the frequency $\omega2$ of the second resonance light L2. Then, when the difference ($\omega1-\omega2$) between the frequency $\omega1$ of the first resonance light L1 and the frequency $\omega2$ of the second resonance light L2 coincides with the frequency corresponding to the energy difference between the first ground state S1 and the second ground state S2, the excitation from the ground states S1, S2 to the excited state stops, respectively. On this occasion, both of the first resonance light L1 and the second resonance light L2 are transmitted without being absorbed by the alkali metal gas 13. Such a phenomenon is called a CPT phenomenon or electromagnetically induced transparency (EIT).

The light source 71 emits such two types of light (the first resonance light L1 and the second resonance light L2) different in frequency from each other as described above toward the gas cell 10. Here, for example, in the case in which the frequency $\omega1$ of the first resonance light L1 is fixed and the frequency $\omega2$ of the second resonance light L2 is varied, the detection intensity of the light detection section 76 rapidly rises as shown in FIG. 23 when the difference ($\omega1-\omega2$) between the frequency $\omega1$ of the first resonance light L1 and the frequency $\omega2$ of the second resonance light L2 coincides with the frequency $\omega0$ corresponding to the energy difference between the first ground state S1 and the second ground state S2. Such a rapid signal as described above is called an EIT signal. The EIT signal has a fixed characteristic value depending on the type of the alkali metal. Therefore, by using such an EIT signal as a reference, the atomic oscillator 101 high in accuracy can be realized.

The gas cell 10 used in the atomic oscillator 101 is required to be small in size and high in quality. According to the configuration of the gas cell of the embodiments described above and the method of manufacturing the gas cell, it is possible to provide the gas cell 10, which is small in size and high in quality (e.g., sensitivity and measurement accuracy), and can preferably be used for the atomic oscillator 101.

The entire disclosure of Japanese Patent Application No. 2016-168975 filed Aug. 31, 2016 is expressly incorporated by reference herein.

What is claimed is:

1. A gas cell comprising:
   a cell including
      a first chamber having a coating material formed on an inside wall,
      a second chamber arranged with the first chamber along a first direction and communicating with the first chamber via a communication hole,
      a reinforcement section extending from the second chamber side of the first chamber in the first direction along the second chamber, and
      an opening section disposed on a side of the second chamber that is opposite to a side where the communication hole is located;
   a sealing section adapted to block the opening section; and
   an alkali metal gas encapsulated in the first chamber,
   wherein the reinforcement section is provided with one of at least one hole and at least one groove.

2. The gas cell according to claim 1, wherein
   one of the at least one hole and the at least one groove extends along the first direction.

3. The gas cell according to claim 1, wherein
   the second chamber has a longitudinal direction, and the longitudinal direction is the first direction.

4. The gas cell according to claim 1, wherein
   the reinforcement section is provided with one of at least two holes that are connected to each other and at least two grooves that are connected to each other.

5. A magnetometric device comprising the gas cell according to claim 1.

6. A magnetometric device comprising the gas cell according to claim 2.

7. A magnetometric device comprising the gas cell according to claim 3.

8. A magnetometric device comprising the gas cell according to claim 4.

9. A method of manufacturing a gas cell, comprising:
   preparing a cell having
      a first chamber,
      a second chamber arranged with the first chamber along a first direction and communicating with the first chamber,
      a reinforcement section disposed on the second chamber side of the first chamber and on a side of the second chamber crossing the first direction, and provided with one of at least one hole and at least one groove, and
      an opening section disposed on an opposite side of the second chamber to the first chamber;
   introducing a coating material into the first chamber through the opening section;

sealing the opening section with a sealing section; and forming the coating material on an inside wall of the first chamber by heating and then cooling the cell, wherein in the sealing the opening section, the cell is disposed vertically above the sealing section and so oriented that the first direction is vertical and the opening section is located on a lower end of the cell to be placed onto the sealing section.

10. The method of manufacturing the gas cell according to claim 9, further comprising:

disposing a solid substance including alkali metal inside the second chamber through the opening section before the sealing the opening section; and irradiating the solid substance with a laser beam after the forming the coating material.

11. A method of manufacturing a magnetometric device comprising the method of manufacturing the gas cell according to claim 9.

\* \* \* \* \*